United States Patent
Shimokawa et al.

(10) Patent No.: US 8,624,125 B2
(45) Date of Patent: Jan. 7, 2014

(54) METAL FOIL LAMINATED POLYIMIDE RESIN SUBSTRATE

(75) Inventors: Hiroto Shimokawa, Ube (JP); Atsushi Okabe, Ube (JP)

(73) Assignee: Ube Industries, Ltd., Ube-shi (JP)

( * ) Notice: Subject to any disclaimer, the term of this patent is extended or adjusted under 35 U.S.C. 154(b) by 288 days.

(21) Appl. No.: 12/739,640

(22) PCT Filed: Oct. 24, 2008

(86) PCT No.: PCT/JP2008/069364
§ 371 (c)(1), (2), (4) Date: Sep. 22, 2010

(87) PCT Pub. No.: WO2009/054505
PCT Pub. Date: Apr. 30, 2009

(65) Prior Publication Data
US 2011/0005812 A1    Jan. 13, 2011

(30) Foreign Application Priority Data
Oct. 24, 2007    (JP) .................................. 2007-276715

(51) Int. Cl.
*H05K 1/03* (2006.01)
*H05K 1/09* (2006.01)

(52) U.S. Cl.
USPC .......................................... 174/255; 174/256

(58) Field of Classification Search
USPC ........................................................ 174/255
See application file for complete search history.

(56) References Cited

U.S. PATENT DOCUMENTS

| | | | |
|---|---|---|---|
| 6,497,806 B1 * | 12/2002 | Endo .............................. | 205/111 |
| 6,525,921 B1 * | 2/2003 | Nakatani et al. ................ | 174/264 |
| 6,541,126 B1 * | 4/2003 | Yoshioka et al. ............. | 428/624 |
| 6,969,557 B2 | 11/2005 | Matsuda et al. | |
| 6,989,199 B2 * | 1/2006 | Yamamoto et al. ........... | 428/607 |
| 7,381,475 B2 * | 6/2008 | Suzuki .......................... | 428/553 |
| 7,532,481 B2 * | 5/2009 | Nagase et al. ................. | 361/739 |
| 2007/0237976 A1 | 10/2007 | Okada et al. | |
| 2008/0170372 A1 * | 7/2008 | Kirigaya ........................ | 361/720 |
| 2009/0162685 A1 * | 6/2009 | Kobayashi et al. ............ | 428/553 |
| 2009/0266589 A1 | 10/2009 | Shimokawa et al. | |

FOREIGN PATENT DOCUMENTS

| | | |
|---|---|---|
| JP | A-2004-025757 | 1/2004 |
| JP | A-2005-344174 | 12/2005 |
| JP | A-2006-147662 | 6/2006 |
| JP | A-2006-278371 | 10/2006 |
| JP | A-2007-134695 | 5/2007 |
| WO | WO-A1-03102277 | 12/2003 |

OTHER PUBLICATIONS

Ube JP2007-134695A_English_Machine_Translation provided in Office Action.*
International Search report issued in corresponding PCT Application No. PCT/JP2008/069364 mailed Jan. 27, 2009.
International Preliminary Report on Patentability and Written Opinion corresponding to PCT Application No. PCT/JP2008/069364, issued Jun. 1, 2010.
Office Action issued in Japanese Patent Application No. 2007-276715 dated Feb. 28, 2012.

* cited by examiner

*Primary Examiner* — Timothy Thompson
*Assistant Examiner* — Roshn Varghese
(74) *Attorney, Agent, or Firm* — Knobbe Martens Olson & Bear LLP

(57) ABSTRACT

The present invention relates to a metal foil laminated polyimide resin substrate wherein
a metal foil is directly laminated on one side or both sides of a polyimide resin substrate; and
the surface of the metal foil to be bonded to the polyimide resin substrate has a surface roughness (Rzjis) of 3.0 μm or less; a surface area ratio (B) of 1.25 to 2.50, in which the surface area ratio (B) is calculated as a ratio [A/6550] of a surface area of a two-dimensional region with a surface area of 6550 μm² which is determined by a laser method (three-dimensional area: A μm²) to the area of the two-dimensional region; and a chromium content per unit area of the two-dimensional region of 2.0 mg/m² or more.

18 Claims, No Drawings

METAL FOIL LAMINATED POLYIMIDE RESIN SUBSTRATE

This application is the U.S. National Phase under 35 U.S.C. §371 of International Application PCT/JP2008/069364, filed Oct. 24, 2008 designating the U.S., and published in Japanese as WO2009/054505 on Apr. 30, 2009, which claims priority to Japanese Patent Application No. 2007-276715, filed Oct. 24, 2007.

TECHNICAL FIELD

The present invention relates to a metal foil laminated polyimide resin substrate comprising a surface-treated metal foil, which allows the production of a metal-wiring polyimide resin substrate exhibiting excellent adhesiveness to an anisotropic conductive film (hereinafter, referred to as "ACF") and an adhesive such as an epoxy resin used for bonding an IC chip to the film; and a process for producing the same. The present invention particularly relates to a metal foil laminated polyimide resin substrate which allows the production of a metal-wiring polyimide resin substrate which may be used for high-performance electronic devices, especially for a flexible wiring substrate with high density wiring, which may be suitably used for reduction in size and weight of an electronic device, a build-up circuit board, an IC carrier tape, or the like.

BACKGROUND ART

A surface-treated copper foil has a surface treated by roughening, rust-proofing or the like in order to improve properties such as adhesive strength to a polyimide resin substrate for a copper-clad laminated sheet. A roughened surface of a surface-treated copper foil is bonded to a polyimide resin substrate to form a copper-clad laminated sheet. Then, a wiring pattern is formed by etching the surface-treated copper foil of the copper-clad laminated sheet, to provide a printed wiring board. On the printed wiring board are mounted electronic components, to provide a circuit board. In this process, electronic components are usually connected to wirings by soldering or wire bonding. Alternatively, an "anisotropic conductive film" (hereinafter, referred to as "ACF") is sometimes employed.

An electronic component mounted on the circuit board must be connected to a wiring with adequate mounting strength for the prevention of the detachment of the component from the printed wiring board during use. The mounting strength is ensured by a soldering area in a soldering method or final resin sealing in a wire bonding method. Meanwhile, in an ACF mounting method, an ACF consisting of a resin component and conductive particles is used to electrically connect an electronic component to a wiring. However, the conductive particles contained in the ACF have no adhesion. Accordingly, due to the presence of the conductive particles, an area where an ACF, an electronic component, and a wiring are laminated may not have adequate adhesion strength. In a circuit board on which electronic components are mounted with an ACF, mounting strength of the electronic components depends on adhesion strength between "a surface of a polyimide resin substrate which is exposed by removing a surface-treated copper foil by etching" (hereinafter, referred to as a "resin base material surface") and the ACF.

Patent Document 1 discloses a copper-clad laminated sheet comprising a copper foil as a conductive layer which is bonded to a flexible insulating layer and contains 0.1 to 10 at % of nickel on the surface bonded to the insulating layer; and a flexible printed wiring board comprising the same. Patent Document 1 explains that when electric connection is established using an ACF, the copper-clad laminated sheet and the flexible printed wiring board have excellent adhesiveness to the ACF and electric and physical connectivity with the ACF. The flexible printed wiring board is produced by selectively etching the copper foil such that nickel remains in an area where the insulating layer is exposed. Specifically, Examples of Patent Document 1 show that a two-layer flexible printed wiring board comprising a surface-treated copper foil which has a thickness of 12 μm and the surface bonded to the insulating layer with a surface roughness Ra of 1.0 μm exhibits excellent rust-prevention properties, etching properties, connectivity of a laser via hole, and adhesiveness to an ACF when the copper foil contains 0.1 to 10 at % of nickel on the surface bonded to the insulating layer as determined by XPS.

Patent Document 2 discloses a process for producing a metal wiring board comprising providing a metal foil-heat resistant resin substrate laminate wherein a metal foil is laminated on a polyimide resin substrate, and the surface of the metal foil to be bonded to the polyimide resin substrate is treated with at least one metal selected from the group consisting of Ni, Cr, Co, Zn, Sn and Mo, and alloys containing at least one of these metals; forming a metal wiring on the resin substrate; and then cleaning the surface of the resin substrate on which the metal wiring is formed with an etching solution capable of removing the metal used in the surface treatment so as to improve adhesiveness of the resin substrate surface.

Patent Document 1: Japanese Laid-open Patent Publication No. 2006-147662.
Patent Document 2: Japanese Laid-open Patent Publication No. 2007-134695.

DISCLOSURE OF THE INVENTION

Problems to be Solved by the Invention

An objective of the present invention is to provide a metal foil laminated polyimide resin substrate wherein a fine-pitch wiring may be formed thereon, and the surface of the polyimide resin substrate which is exposed by removing the metal foil such as a copper foil, for example, by etching may exhibit excellent adherence to an adhesive organic material such as an anisotropic conductive film, based on the study of a metal foil and a polyimide resin substrate used for a metal foil laminated polyimide resin substrate, particularly the surface of the metal foil.

Another objective of the present invention is to provide a metal foil laminated polyimide resin substrate wherein a fine-pitch wiring may be formed thereon, and the surface of the polyimide resin substrate which is exposed by removing the metal foil such as a copper foil, for example, by etching may exhibit excellent adherence to an adhesive organic material such as an anisotropic conductive film, and excellent filling characteristics between the polyimide resin substrate and the metal foil.

Furthermore, an objective of the present invention is to provide a metal foil laminated polyimide resin substrate wherein a metal foil is laminated on a thermocompression-bondable polyimide resin substrate using a hot-press forming machine, and the surface of the polyimide resin substrate which is exposed by removing the metal foil, for example, by etching may exhibit excellent adherence to an adhesive organic material such as an anisotropic conductive film, and excellent filling characteristics between the polyimide resin substrate and the metal foil; and a process for producing the same.

Means for Solving the Problems

In the first aspect, the present invention relates to a metal foil laminated polyimide resin substrate wherein
a metal foil is directly laminated on one side or both sides of a polyimide resin substrate; and
the surface of the metal foil to be bonded to the polyimide resin substrate has
a surface roughness (Rzjis) of 3.0 μm or less;
a surface area ratio (B) of 1.25 to 2.50, in which the surface area ratio (B) is calculated as a ratio [A/6550] of a surface area of a two-dimensional region with a surface area of 6550 μm$^2$ which is determined by a laser method (three-dimensional area: A μm$^2$) to the area of the two-dimensional region; and
a chromium content per unit area of the two-dimensional region of 2.0 mg/m$^2$ or more.

In the second aspect, the present invention relates to a wiring board having a metal wiring which is formed by etching the metal foil on one side or both sides of the metal foil laminated polyimide resin substrate of the first aspect of the present invention.

In the third aspect, the present invention relates to a process for producing a metal foil laminated polyimide resin substrate wherein a metal foil having the undermentioned properties of the surface of the metal foil to be bonded to the polyimide resin substrate is laminated on one side or both sides of a polyimide resin substrate having a thermocompression-bondable surface to be bonded to the metal foil:
(Properties of the Surface of the Metal Foil to be Bonded to the Polyimide Resin Substrate)
a surface roughness (Rzjis) is 3.0 μm or less.
a surface area ratio (B), which is calculated as a ratio [A/6550] of a surface area of a two-dimensional region with a surface area of 6550 μm$^2$ which is determined by a laser method (three-dimensional area: A μm$^2$) to the area of the two-dimensional region, is 1.25 to 2.50.
a chromium content per unit area of the two-dimensional region is 2.0 mg/m$^2$ or more.
comprising
bonding the surface of the metal foil having the above-mentioned properties to the thermocompression-bondable surface of the polyimide resin substrate, using a hot-press forming machine.

Furthermore, in the first aspect of the present invention, when the surface of the metal foil to be bonded to the polyimide resin substrate has a surface area ratio (B), which is calculated as a ratio [A/6550] of a surface area of a two-dimensional region with a surface area of 6550 μm$^2$ which is determined by a laser method (three-dimensional area: A μm$^2$) to the area of the two-dimensional region, of 1.60 to 2.50, adherence or adhesiveness of the surface of the polyimide resin substrate which is exposed by removing the metal foil of the metal foil laminated polyimide resin substrate (resin base material surface) to an adhesive organic material layer (an adhesive etc.) may be further improved.

Furthermore, in the first aspect of the present invention, when the surface of the metal foil to be bonded to the polyimide resin substrate has a surface roughness (Rzjis) of 2.5 μm or less, filling characteristics between the metal foil and the polyimide resin substrate may be further improved, and therefore an excellent wiring board material may be obtained and a fine wiring may be formed on the wiring board material with a reduced rejection rate. When a metal foil is directly laminated on a polyimide resin substrate by thermocompression bonding, in particular, the metal foil laminated polyimide resin substrate obtained may exhibit excellent filling characteristics between the metal foil and the polyimide resin substrate.

In the first aspect of the present invention, when the surface of the metal foil to be bonded to the polyimide resin substrate has a surface roughness (Rzjis) of 2.5 μm or less, and a surface area ratio (B), which is calculated as a ratio [A/6550] of a surface area of a two-dimensional region with a surface area of 6550 μm$^2$ which is determined by a laser method (three-dimensional area: A μm$^2$) to the area of the two-dimensional region, of 1.60 to 2.50, in particular, the metal foil laminated polyimide resin substrate obtained may exhibit excellent filling characteristics between the metal foil and the polyimide resin substrate, and excellent adherence of the surface of the polyimide resin substrate which is exposed by removing the metal foil of the metal foil laminated polyimide resin substrate to an adhesive organic material layer.

There will be described preferred embodiments of the first aspect of the present invention (a metal foil laminated polyimide resin substrate of the present invention) and the third aspect of the present invention (a process for producing a metal foil laminated polyimide resin substrate of the present invention). Two or more of these embodiments may be appropriately combined.

1) The metal foil has a roughened surface to be bonded to the polyimide resin substrate,
before surface roughening, a metal foil (untreated metal foil) has a surface to be bonded to the polyimide resin substrate with a surface roughness (Rzjis) of less than 1.0 μm, and
a ratio [b/a] of the surface area after surface roughening (three-dimensional area: b μm$^2$) to the surface area before surface roughening (three-dimensional area: a μm$^2$) of a two-dimensional region with a surface area of 6550 μm$^2$ which is determined by a laser method is in the range of 1.20 to 2.50.

2) The surface of the metal foil to be bonded to the polyimide resin substrate comprises a nickel-zinc alloy layer in an amount of 40 mg/m$^2$ or more per unit area of the two-dimensional region. In other words, in the surface of the metal foil to be bonded to the polyimide resin substrate, the total amount of nickel and zinc per unit area of the two-dimensional region is 40 mg/m$^2$ or more.

3) The surface of the metal foil to be bonded to the polyimide resin substrate has an L value of from 47 to 63 in the Lab color coordinate system.

4) The surface of the metal foil to be bonded to the polyimide resin substrate has a coupling agent layer.

5) The metal foil is an electrolytic copper foil.

6) The polyimide resin substrate is made of polyimide. The polyimide resin substrate preferably comprises a heat-resistant polyimide layer and a thermocompression-bondable polyimide layer, which is laminated on at least one side of the heat-resistant polyimide layer, and the metal foil may be preferably laminated on the thermocompression-bondable polyimide layer.

7) The polyimide resin substrate has at least one thermocompression-bondable surface; and the metal foil is bonded to the thermocompression-bondable surface of the polyimide resin substrate using a hot-press forming machine.

8) The polyimide resin substrate has a thermocompression-bondable layer to be bonded to the metal foil; and a thickness of the thermocompression-bondable layer is equal to or greater than a surface roughness (Rzjis) of the surface of the metal foil to be bonded to the polyimide resin substrate. The thickness of the thermocompression-bondable layer of the polyimide resin substrate to be bonded to the metal foil is preferably equal to or greater than a surface roughness (Rzjis) of the surface of the metal foil to be bonded to the polyimide resin substrate, and less than or equal to 3 µm.

9) The metal foil laminated polyimide resin substrate is to be used for the production of a wiring board which has a metal wiring formed by etching the metal foil.

10) The metal foil laminated polyimide resin substrate is to be used in an application where an adhesive organic material layer is formed on at least a portion of the exposed surface of the resin substrate which is formed by removing a portion of the metal foil.

There will be described preferred embodiments of the second aspect of the present invention (a wiring board of the present invention). Two or more of these embodiments may be appropriately combined.

1) An adhesive organic material layer (an adhesive layer etc.) is laminated on the metal wiring side of the wiring board.

2) The adhesive organic material layer acts as at least one of a conductive layer, an insulating layer, a protective layer, an adhesion layer, a sealing layer, and a seal layer.

3) The wiring board is to be used in an application where an adhesive organic material layer is formed on at least a portion of the exposed surface of the resin substrate which is formed by removing the metal foil after the formation of metal wiring.

Effect of the Invention

A metal foil laminated polyimide resin substrate of the present invention is excellent in adherence and adhesiveness of the resin substrate surface between metal wirings which is exposed by removing the metal (resin base material surface). When an adhesive organic material layer is directly laminated on the resin substrate surface exposed by removing the metal, excellent adherence and adhesiveness between the organic material layer and the substrate surface may be achieved. Therefore, when the adhesive organic material layer acts as at least one of a conductive layer (for example, an anisotropic conductive layer etc.), an insulating layer, a protective layer (for example, a solder resist layer etc.), an adhesion layer, a sealing layer, and a seal layer, for example, improved reliability may be achieved. For example, a metal foil laminated polyimide resin substrate of the present invention may exhibit excellent adherence and adhesiveness of a polyimide film surface to a material adhered thereto such as an epoxy resin and an anisotropic conductive film, and therefore an ACF may be bonded to a metal-wiring polyimide resin substrate with improved reliability, and an IC chip may be bonded to a metal-wiring polyimide resin substrate via such an adhesive with improved reliability.

Furthermore, a metal foil laminated polyimide resin substrate of the present invention may have stable peel strength between a metal foil and a polyimide resin substrate, and exhibit excellent formability of fine wiring.

A fine wiring may be formed by etching the metal foil of the metal foil laminated polyimide resin substrate of the present invention, and a flexible wiring substrate with high density wiring, a build-up circuit board, an IC carrier tape, and the like may be produced from the metal foil laminated polyimide resin substrate.

BEST MODE FOR CARRYING OUT THE INVENTION

In the metal foil laminated polyimide resin substrate of the present invention, a surface of the metal foil to be bonded to the polyimide resin substrate has the following properties:

a surface roughness (Rzjis) is 3.0 µm or less.

a surface area ratio (B), which is calculated as a ratio [A/6550] of a surface area of a two-dimensional region with a surface area of 6550 µm$^2$ which is determined by a laser method (three-dimensional area: A µm$^2$) to the area of the two-dimensional region, is 1.25 to 2.50.

a chromium content per unit area of the two-dimensional region is 2.0 mg/m$^2$ or more.

A surface roughness (Rzjis) of the surface of the metal foil to be bonded to the polyimide resin substrate is defined as an average value of 20 measured value of ten-point average roughness, which is specified by JIS standards, of the surface of the metal foil to be bonded to the polyimide resin substrate.

In the present invention, a surface roughness (Rzjis) of the surface of the metal foil to be bonded to the polyimide resin substrate has the upper limit of 3.0 µm. In the present invention, as described later, metal particles, preferably substantially spherical metal particles (roughening particles) may be formed on the surface of the metal foil to be bonded to the polyimide resin substrate by roughening treatment. When a surface roughness (Rzjis) of the surface of the metal foil to be bonded to the polyimide resin substrate is 3.0 µm or less, fine metal particles as roughening particles are formed and stuck on the surface of the metal foil by electrolysis without extremely high concentration of current, and there are very few metal particles deposited on each other, and thus no or very few extraordinarily-protruding electro-deposited roughening particles are formed on the surface of the metal foil to be bonded to the polyimide resin substrate. Accordingly, a surface-treated metal foil, preferably a surface-treated copper foil having a surface to be bonded to a polyimide resin substrate with a surface roughness (Rzjis) of 3.0 µm or less may be suitable for the production of a fine-pitch printed wiring board. Furthermore, a metal foil laminated polyimide resin substrate which comprises a metal foil having a surface to be bonded to a polyimide resin substrate with a surface roughness (Rzjis) of 3.0 µm or less may exhibit excellent adherence of the surface of the polyimide resin substrate, which is exposed by removing the metal foil, for example, by etching, to an adhesive organic material layer.

When the surface roughness (Rzjis) of the surface of the metal foil to be bonded to the polyimide resin substrate is 2.5 µm or less, the metal foil laminated polyimide resin substrate may have excellent filling characteristics between the polyimide resin substrate and the metal foil, resulting in improvements in reliability of the wiring board. In addition, a metal foil having a surface to be bonded to a polyimide resin substrate with a surface roughness (Rzjis) of 2.5 µm or less may be suitably used for the production of a printed wiring board wherein fine wiring is formed.

In the light of stable peel strength between the polyimide resin substrate and the metal foil, a surface roughness (Rzjis) of the surface of the metal foil to be bonded to the polyimide resin substrate is preferably 1.3 µm to 3.0 µm, more preferably 1.4 µm to 2.5 µm, particularly preferably 1.6 µm to 2.4 µm.

In the present invention, the surface of the metal foil to be bonded to the polyimide resin substrate has a surface area ratio (B), which is calculated as a ratio [A/6550] of "a surface area of a two-dimensional region with a surface area of 6550 µm$^2$ which is determined by a laser method (three-dimensional area: A µm$^2$)" to "the area of the two-dimensional region (6550 µm$^2$)", of 1.25 to 2.50, preferably 1.40 to 2.30, more preferably 1.60 to 2.20, further preferably 1.70 to 2.10. The surface area ratio (B) is an alternative index of the contact area between the surface-treated metal foil and the polyimide resin substrate.

A metal foil of a metal foil laminated polyimide resin substrate preferably has the largest contact area with the polyimide resin substrate with the smallest amount of roughening particles, when the metal foil laminated polyimide resin substrate is used for the formation of fine wiring by etching. In addition, roughening particles preferably have a substantially spherical shape to provide stable adhesion strength by an anchor effect. When roughening particles have a substantially spherical shape, a "replica having a shape of roughening particles" (hereinafter, referred to as "replica" for short) which is formed in the resin base material surface of the metal foil laminated polyimide resin substrate has a substantially spherical shape.

When an electronic component is mounted on the metal foil laminated polyimide resin substrate using an adhesive organic material layer (an ACF and an adhesive such as an epoxy resin), the replica is filled with the resin component in the adhesive organic material layer, which means the adhesive organic material layer takes the shape of a roughening particle formed on the surface of the metal foil bonded to the polyimide resin substrate. Accordingly, the shape of a roughening particle formed on the surface of the metal foil bonded to the polyimide resin substrate has an effect on adhesion strength between the resin base material surface of the metal foil laminated polyimide resin substrate (the surface of the polyimide resin substrate which is exposed by removing the metal foil by etching) and the adhesive organic material layer in all cases including in a case where chemical adhesiveness never contributes to adhesion strength in the contact area between the resin base material surface and the adhesive organic material layer, in a case where chemical adhesiveness hardly contributes to adhesion strength in the contact area, and in a case where chemical adhesiveness contributes to adhesion strength in the contact area. The shape of the replica is preferably fine and minute in high density for stable adhesion strength or adhesiveness between the resin base material surface and the adhesive organic material layer. In other words, it may be ideal that the fine roughening particles are uniformly formed on the surface of the metal foil to be bonded to the polyimide resin substrate by roughening treatment. Accordingly, a surface area ratio (B) is important, which reflects the shape and the state of the roughening particle, and is an alternative index of the contact area between the metal foil and the polyimide resin substrate.

The shape of the roughening particle formed by roughening treatment, and the state of the metal foil surface considerably vary, depending on the roughening treatment conditions. When the B value of the surface of the metal foil to be bonded to the polyimide resin substrate after roughening treatment is less than 1.25, the distribution of the roughening particles formed by roughening treatment is more likely to be uneven and/or the roughening particles is more likely to have a shape (for example, a conical shape, a hemispheric shape, or the like) which does not provide a sufficient anchor effect. In such cases, adequate adhesion strength between the resin base material surface of the metal foil laminated polyimide resin substrate and the adhesive organic material layer may not be achieved, and adhesion strength and the like may not be uniform more frequently. Thus, it is not preferred that the B value is less than 1.25.

The B value is particularly preferably 1.60 or more because adhesion strength between the resin base material surface of the metal foil laminated polyimide resin substrate and the adhesive organic material layer may be further improved.

When the B value is more than 2.5, the roughening particles formed may vary greatly in particle size, resulting in the state in which smaller particles are hidden among larger particles. When the roughening particles have widely varying size, it may be difficult to reduce an over-etching time in forming a wiring by etching. Additionally, the resin component in the adhesive organic material layer may less satisfactorily fill the replica formed in the resin base material surface of the metal foil laminated polyimide resin substrate. Thus, it is not preferred that the B value is more than 2.5.

Therefore, the B value is preferably 1.25 to 2.50, more preferably 1.40 to 2.30, further preferably 1.60 to 2.20, particularly preferably 1.70 to 2.10, which means that the surface of the metal foil to be bonded to the polyimide resin substrate has a shape to provide excellent adhesion strength between the resin base material surface of the metal foil laminated polyimide resin substrate and the adhesive organic material layer, and to exhibit improved adherence of the surface of the metal foil to the polyimide resin substrate and excellent chemical resistance such as resistance to a chemical agent used for substrate cleaning and substrate processing, for example, metal plating such as tin plating.

As for roughening treatment of a metal foil, there will be briefly described a technique for forming and attaching fine metal particles (roughening particles) on a surface of an untreated metal foil (unroughened metal foil).

Substantially spherical metal roughening particles may be formed by electrolytic plating or electroless plating, for example. In the case of electrolytic plating, roughening particles may be formed by metal plating in two steps; specifically, by forming a core of a particle on a surface of an untreated metal foil (unroughened metal foil) in the first step, and providing firmer adhesion of the core to the untreated metal foil and growing the core in the second step.

There will be described an example of a process for plating a copper foil with copper as an example of metal plating for the formation of roughening particles.

In the first step, copper particle cores are formed on a surface of an untreated copper foil by electrolysis under the burnt plating conditions wherein a electrolyte solution containing 10 g/L to 25 g/L of copper, 50 g/L to 150 g/L of free sulfuric acid, and optionally an additive such as gelatin as a copper sulfate-based electrolyte solution is used, the electrolyte solution temperature is 15° C. to 30° C., the untreated copper foil acts as a cathode, and the cathode current density is 20 A/dm$^2$ to 50 A/dm$^2$. Subsequently, in the second step, roughening particles in the desired shape are formed by plating the copper particle cores with copper under the conditions wherein a electrolyte solution containing 45 g/L to 100 g/L of copper and 50 g/L to 150 g/L of free sulfuric acid as a copper sulfate-based electrolyte solution is used, the electrolyte solution temperature is 30° C. to 50° C., and the cathode current density is 30 A/dm$^2$ to 60 A/dm$^2$, whereby the copper particle cores are covered with copper to smooth out and give a desired shape to them.

In the present invention, it is preferred that a surface of an untreated metal foil such as an untreated copper foil to be used, which is to be bonded to a polyimide resin substrate, has a surface roughness (Rzjis) of less than 1.0 μm before surface roughening. In addition, a ratio [b/a] of the surface area after surface roughening (three-dimensional area: b μm$^2$) to the surface area before surface roughening (three-dimensional area: a μm$^2$) of a two-dimensional region with a surface area of 6550 μm$^2$ which is determined by a laser method is preferably in the range of 1.20 to 2.50, more preferably 1.40 to 2.40, further preferably 1.65 to 2.30, particularly preferably 1.70 to 2.20.

As described above, an untreated metal foil (unroughened metal foil) preferably has a surface roughness (Rzjis) of less than 1.0 μm, more preferably 0.9 μm or less, further preferably 0.8 µm or less, before surface roughening. An untreated metal foil (unroughened metal foil) having a surface roughness (Rzjis) of less than 1.0 µm is used so as to prevent the formation of roughening particles predominantly in an extraordinarily-protruding part, an uneven part, and the like, which results in the local formation of roughening particles by roughening treatment. It is preferred that an untreated metal foil (unroughened metal foil) has a smooth and flat surface, which is to be roughened.

Meanwhile, conventional copper foils used for a printed wiring board, which are not used in the present invention, are electrolytic copper foils having a deposition surface which is treated by surface roughening. The deposition surface of the electrolytic copper foil has a shape in which copper is deposited in the shape of a mountain or a cone; and the deposition surface has a surface roughness (Rzjis) of 2 µm or more before surface roughening. When such a deposition surface of an electrolytic copper foil is subjected to surface roughening, larger roughening particles are formed on the apex of the cone of the deposition surface and roughening particles are hardly formed on the base and edge of the cone. Thus, when the surface roughness (Rzjis) is 1.0 µm or more, roughening particles are more predominantly formed on a protrusion and the like by roughening treatment, which results in the occurrence of an extraordinary protrusion, or an extraordinarily-protruding part. When the surface roughness (Rzjis) exceeds the above upper limit, the deposition surface frequently has undulations and/or irregularities of the surface which is observed with a scanning electron microscope.

When the ratio [b/a] of the surface area after surface roughening (three-dimensional area: b µm$^2$) to the surface area before surface roughening (three-dimensional area: a µm$^2$) as described above is less than 1.20, the surface is not uniformly and satisfactorily roughened, and substantially spherical roughening particles are not formed; therefore an adequate anchor effect may not be achieved by the surface roughening. In such cases, a resin base material surface of a metal foil laminated polyimide resin substrate comprising such a metal foil may not exhibit adequate adherence to a resin component in an adhesive organic material layer. When the ratio [b/a] is more than 2.50, the surface is excessively roughened, and the roughening particles formed may vary greatly in particle size, and/or the roughening particles may not be deposited in a fine state, and/or the roughening particle may be massive, and not substantially spherical in shape. In such cases, a resin base material surface of a metal foil laminated polyimide resin substrate comprising such a metal foil may not exhibit stable adherence to a resin component in an adhesive organic material layer due to less uniform anchor effect.

In the metal foil laminated polyimide resin substrate of the present invention, the metal foil has a surface to be bonded to the polyimide resin substrate in which a chromium content per unit area of the two-dimensional region is 2.0 mg/m$^2$ or more. In other words, not less than 2.0 mg of chromium is present in 1 m$^2$ of the two-dimensional region of the surface of the metal foil to be bonded to the polyimide resin substrate. Chromium is a rust inhibitor component, which is widely used for rust-proofing a surface-treated copper foil for a printed wiring board. Chromium is a passive metal, which forms an oxygen-containing passive film on the surface thereof, and has high corrosion resistance. Therefore, a printed wiring board having excellent chemical resistance may be obtained when using a surface-treated metal foil such as a surface-treated copper foil which has a chromium component on a surface to be bonded to a polyimide resin substrate.

When the chromium content per unit area of the two-dimensional region is 2.0 mg/m$^2$ or more, a chromium passive film adequately covers the surface of the metal foil such as a copper foil which is to be bonded to a polyimide resin substrate; therefore stable adhesiveness between the metal foil and the polyimide resin substrate may be achieved, and adhesiveness of the resin base material surface of the metal foil laminated polyimide resin substrate, which is exposed by etching, to an adhesive organic material layer may be improved. When the chromium content per unit area of the two-dimensional region is less than 2.0 mg/m$^2$, neither adhesiveness between the polyimide resin substrate and the surface-treated metal foil in the metal foil laminated polyimide resin substrate nor adhesiveness of the resin base material surface of the metal foil laminated polyimide resin substrate, which is exposed by etching, to an adhesive organic material layer may be improved.

Meanwhile, in a typical chromate treatment process used for the production of surface-treated copper foils, the upper limit of chromium content is approximately 7.0 mg/m$^2$ due to the composition of the chromate treatment solution, and the like. However, when an excessive amount of chromium is present on or in a surface of a metal foil such as a copper foil which is to be bonded to a polyimide resin substrate, chromium may remain on the resin base material surface, depending on the etching conditions for forming a wiring. Accordingly, and also in view of migration resistance, a chromium content per unit area of the two-dimensional region of the surface of the metal foil to be bonded to the polyimide resin substrate is preferably 2.2 mg/m$^2$ to 6.0 mg/m$^2$, more preferably 2.5 mg/m$^2$ to 5.0 mg/m$^2$.

The term "chromium content" as used herein refers to the amount of chromium both in a case where chromium is present alone and in a case where chromium is present in combination with other rust inhibitor components. Examples of the combination of rust inhibitor components include combinations of a zinc rust inhibitor, a brass rust inhibitor, a zinc-nickel alloy rust inhibitor, a zinc-cobalt alloy rust inhibitor, or the like, and chromate or chromium. The term "chromium content of a surface of a metal foil to be bonded to a polyimide resin substrate" as used herein refers to the amount of chromium which is present in the side of the metal foil to be bonded to a polyimide resin substrate. The metal foil laminated polyimide resin substrate of the present invention may comprise a layer containing another rust inhibitor component, for example, between the metal foil and the layer containing chromium (hereinafter, also referred to as "chromium layer"). The chromium content, or the amount of chromium means the amount of chromium atom.

A chromium component may be deposited on a surface of a metal foil such as a copper foil (surface to be bonded to a polyimide resin substrate) by a chromate treatment process, for example. One example of the chromate treatment processes is electrolysis in which a chromate treatment bath containing 0.5 g/L to 2 g/L of CrO$_3$ is used, the electrolyte solution temperature is 15° C. to 35° C., and the cathode current density is 0.2 A/dm$^2$ to 4 A/dm$^2$.

Furthermore, in the metal foil laminated polyimide resin substrate of the present invention, the total amount of nickel and zinc present in 1 m$^2$ of the two-dimensional region of the surface of the metal foil to be bonded to the polyimide resin substrate is preferably 40 mg or more, more preferably 40 mg to 100 mg, further preferably 42 mg to 90 mg, further preferably 45 mg to 80 mg, particularly preferably 48 mg to 70 mg. When the total amount of nickel and zinc as rust inhibitor components is less than 40 mg/m$^2$, the nickel-zinc alloy layer may not adequately cover the surface of the metal foil in some parts, and adhesion strength or adhesiveness between the polyimide resin substrate and the metal foil in the metal foil laminated polyimide resin substrate may not be improved. 40 mg/m$^2$ of nickel-zinc alloy is required for covering a completely flat ideal plane with a nickel-zinc alloy layer with a thickness of about 40 Å (about 4 nm). When nickel-zinc alloy is used in an amount sufficient to cover an ideal plane with a nickel-zinc alloy layer with a thickness of 40 Å, substantially all of the roughened surface, in which roughening particles are formed on a smooth surface of a metal foil, including the surfaces of the roughening particles, may be two-dimensionally covered with a nickel-zinc alloy, so long as the fine and similarly-shaped roughening particles are formed. Meanwhile, when the total amount of nickel and zinc is more than 100 mg/m$^2$, it may be difficult to remove the nickel-zinc alloy layer with a copper etchant solution, and therefore undesired nickel-zinc alloy may remain after etching. Thus, it is preferred that the total amount of nickel and zinc is 100 mg/m$^2$ or less.

In the present invention, nickel and zinc are formed as a nickel-zinc alloy layer. The nickel-zinc alloy layer to be formed may preferably have the following composition.

The nickel-zinc alloy layer may preferably contain 65 wt % to 90 wt % of nickel and 10 wt % to 35 wt % of zinc based on the total amount of nickel and zinc, excepting incidental impurities. Herein, the percentage by weight (wt %) of nickel and zinc are based on the total amount of nickel and zinc (total amount of nickel and zinc: 100 wt %), excepting incidental impurities. Due to the presence of nickel in the nickel-zinc alloy layer, wettability of the surface of the metal foil to be bonded to the polyimide resin substrate may be enhanced when laminating the metal foil on the polyimide resin substrate for the production of the metal foil laminated polyimide resin substrate. Consequently, adhesiveness between the polyimide resin substrate and the metal foil, as well as rust-prevention properties, may be improved by the formation of the nickel-zinc alloy layer. In addition, the nickel-zinc alloy layer acts as a barrier to prevent direct contact between the metal foil and the polyimide resin substrate when a flexible printed wiring board comprising the metal foil laminated polyimide resin substrate is subjected to heat treatment. Consequently, deterioration of the resin catalyzed by a metal component in the metal foil may be prevented, and therefore peel strength of a wiring after heat treatment may not be reduced.

When the amount of nickel in the nickel-zinc alloy layer is more than 90 wt %, it may be difficult to remove the nickel-zinc alloy layer with a metal etchant solution such as a copper etchant solution, and therefore undesired nickel-zinc alloy may remain after etching. Thus, it is not preferred that the amount of nickel in the nickel-zinc alloy layer is more than 90 wt %. When the amount of zinc in the nickel-zinc alloy layer is more than 35 wt %, adhesiveness between the metal foil and the polyimide resin substrate in the metal foil laminated polyimide resin substrate may be reduced, and chemical resistance such as resistance to a metal plating solution may be reduced in the polyimide resin substrate and the surface of the metal foil to be bonded to the polyimide resin substrate, resulting in the occurrence of deposition of tin in the polyimide resin substrate and the metal foil during tin plating, for example. Thus, if a nickel-zinc alloy layer is formed, the nickel-zinc alloy layer preferably contains 65 wt % to 90 wt % of nickel and 10 wt % to 35 wt % of zinc, more preferably 70 wt % to 85 wt % of nickel and 30 wt % to 15 wt % of zinc, so that adhesiveness between the metal foil and the polyimide resin substrate may be improved, for example, and no undesired nickel-zinc alloy may remain after etching reliably.

The nickel-zinc alloy layer as described above is preferably formed by electrolytic plating in which a solution containing 1 g/L to 35 g/L of nickel from nickel sulfate, 0.1 g/L to 1 g/L of zinc from zinc pyrophosphate, and 50 g/L to 250 g/L of potassium pyrophosphate is used, the solution temperature is 20° C. to 50° C., the pH is 8 to 11, and the current density is 0.3 A/dm$^2$ to 10 A/dm$^2$, for example. A nickel-zinc alloy layer with high uniformity of thickness may be formed by electrolytic plating under the conditions as described above.

The surface of the metal foil to be bonded to the polyimide resin substrate may be preferably treated with a silane coupling agent as the final surface treatment. A silane coupling agent acts as an auxiliary for improving wettability of the surface of the metal foil to be bonded to the polyimide resin substrate, and peel strength between the polyimide resin substrate and the surface of the metal foil to be bonded to the polyimide resin substrate, and the like.

Examples of the silane coupling agent to be used include various silane coupling agents such as epoxy-functional silane coupling agents, which are most commonly used, olefin-functional silane coupling agents, and acryl-functional silane coupling agents. The silane coupling agent may be preferably an amino-functional silane coupling agent, or a mercapto-functional silane coupling agent. When using an amino-functional silane coupling agent, or a mercapto-functional silane coupling agent, adhesion strength, and the like may be further improved.

Specific examples of the silane coupling agent include coupling agents which are used on a glass cloth in a prepreg for a printed wiring board; specifically, vinyl trimethoxy silane, vinyl tris(2-methoxy ethoxy) silane, vinyl phenyl trimethoxy silane, γ-methacryloxypropyl trimethoxy silane, γ-glycidoxypropyl trimethoxy silane, 4-glycidyl butyl trimethoxy silane, γ-aminopropyl triethoxy silane, N-β-(aminoethyl)-γ-aminopropyl trimethoxy silane, N-3-(4-(3-aminopropoxy)butoxy)propyl-3-aminopropyl trimethoxy silane, imidazole silane, triazine silane, and γ-mercaptopropyl trimethoxy silane.

A similar effect may be achieved when the surface of the metal foil to be bonded to the polyimide resin substrate is treated with a titanate-based coupling agent, or a zirconate-based coupling agent, instead of a silane coupling agent.

A surface treatment with a silane coupling agent may be conducted by a known method. A surface treatment with a silane coupling agent may be conducted by applying a solution containing a silane coupling agent to a surface of a metal foil to be bonded to a polyimide resin substrate, and then heating the metal foil to remove the solvent therefrom, for example.

In the present invention, the surface of the metal foil to be bonded to the polyimide resin substrate preferably has an L value in the Lab color coordinate system of from 47 to 63. The "L value in the Lab color coordinate system" as used herein indicates lightness. A greater L value indicates a lighter color. The concept of an L value may be applied to the surface of the metal foil to be bonded to the polyimide resin substrate. A surface having a lighter color may have the roughening particles which are ununiformly formed thereon and/or have widely varying size, for example, and therefore a lighter color, or an L value may be used as an index to inadequate surface roughening treatment level. Accordingly, when the L value is more than 63, the surface may not be adequately roughened, and the resin base material surface, which is exposed by removing the metal foil of the metal foil laminated polyimide resin substrate, may not exhibit adequate adherence to an adhesive organic material layer. In addition, adhesion strength between the polyimide resin substrate and the metal foil in the metal foil laminated polyimide resin substrate may be reduced. Thus, it is not preferred that the L value is more than 63.

The L value may be measured in accordance with JIS-Z8722.

When the L value is less than 47, the surface may be excessively roughened, and some coarse roughening particles may be formed in part. Even though some coarse roughening particles are formed, replica of fine roughening particles provides an anchor effect, and therefore the resin base material surface, which is exposed by removing the metal foil of the metal foil laminated polyimide resin substrate, may exhibit adequate adherence to an adhesive organic material layer. Meanwhile, a thinner polyimide resin substrate is sometimes used in a metal foil laminated polyimide resin substrate so as to reduce the weight and improve the flex resistance and the heat resistance. In the case where a polyimide resin substrate is thinner, and some coarse roughening particles may be formed on a surface of a metal foil to be bonded to the polyimide resin substrate, the coarse roughening particles may reach into a base material which is not thermocompression-bondable, e.g. a heat-resistant polyimide layer, through a thermocompression-bondable layer for laminating (thermo-compression bonding) the metal foil onto the polyimide resin substrate, if the coarse roughening particles are too large. In that case, some of the roughening particles are in direct contact with the base material which is not thermocompression-bondable, and little adhesiveness may be achieved in such an area. Accordingly, the metal foil laminated polyimide resin substrate obtained may have peel strength between the polyimide resin substrate and the metal foil which varies greatly with position. Thus, it is not preferred that the L value is less than 47.

Thus, the L value is preferably in the range of 47 to 63, more preferably 48 to 60, further preferably 48 to 58, particularly preferably 49 to 57, so that the resin base material surface of the metal foil laminated polyimide resin substrate may exhibit adequate adherence to an adhesive organic material layer, and adequate adhesion strength between the polyimide resin substrate and the metal foil may be achieved.

In the present invention, if the polyimide resin substrate has a thermocompression-bondable layer to be bonded to the metal foil, the thickness of the thermocompression-bondable layer is preferably equal to or greater than the surface roughness (Rzjis) of the surface of the metal foil to be bonded to the polyimide resin substrate. When the thickness of the thermocompression-bondable layer is less than the surface roughness (Rzjis) of the metal foil, the whole roughening particle may not be buried in the thermocompression-bondable layer of the polyimide resin substrate. In that case, as described above, the metal foil laminated polyimide resin substrate obtained may have peel strength between the polyimide resin substrate and the metal foil which varies greatly with position.

Examples of the metal foil to be used in the present invention include, but not limited to, metal foils such as a copper foil and a copper alloy foil including an electrolytic copper foil and a rolled copper foil, an aluminum foil and an aluminum alloy foil, a stainless steel foil, and a nickel foil and a nickel alloy foil (alloy 42, for example). Although there are no particular restrictions to the thickness of the metal foil, it may be preferably 1 µm to 100 µm, more preferably 2 µm to 50 µm, further preferably 3 µm to 35 µm, further preferably 6 µm to 25 µm, particularly preferably 8 µm to 20 µm. A copper foil and a copper alloy foil such as an electrolytic copper foil and a rolled copper foil may be suitably used.

When using an ultrathin metal foil (a metal foil which has a thickness of 1 µm to 8 µm, preferably 2 µm to 8 µm, for example), a metal foil with a protective foil (a carrier foil, for example) to reinforce and protect the metal foil may be used. There are no particular restrictions to the material for the protective foil (carrier foil), so long as it may be bonded to a metal foil such as an ultrathin copper foil, and serve to reinforce and protect the metal foil. Examples of the protective foil (carrier foil) to be used include an aluminum foil, a copper foil, and a metal-coated resin foil. There are no particular restrictions to the thickness of the protective foil (carrier foil), so long as the protective foil may reinforce an ultrathin metal foil. The thickness of the protective foil (carrier foil) may be generally 10 µm to 200 µm, more preferably 12 µm to 100 µm, particularly preferably 15 µm to 75 µm.

Any protective foil (carrier foil) may be used, so long as it is flatly laminated on an ultrathin metal foil such as an ultrathin copper foil when used.

A metal foil with a protective foil (carrier foil) in which the protective foil (carrier foil) is bonded to the metal foil such as an ultrathin copper foil is transported through a continuous manufacturing process, and the protective foil (carrier foil) is bonded to the metal foil at least until the completion of the production of a metal foil laminated polyimide resin substrate, which allows improvements in handling characteristics.

The protective foil (carrier foil) may be removed from the metal foil such as a copper foil, for example, by (1) peeling the protective foil (carrier foil) from the metal foil after the metal foil with the protective foil (carrier foil) is laminated on a polyimide resin substrate; or (2) removing the protective foil (carrier foil) from the metal foil by etching after the metal foil with the protective foil (carrier foil) is laminated on a polyimide resin substrate.

In the case of an electrolytic copper foil with a carrier foil, the carrier foil should be electrically conductive because electrodeposition of a copper component on a surface of the carrier foil is conducted to form the electrolytic copper foil.

There will now be described a polyimide resin substrate.

There are no particular restrictions to the polyimide resin substrate, so long as it may be laminated on or bonded to a metal foil without any trouble, for example, by the application of heat and/or pressure, it may be easily produced, it may have good handling properties, a metal foil such as a copper foil laminated thereon may be removed by etching, it may have excellent heat resistance and excellent electrical insulating properties, and if necessary, it may sufficiently support a metal foil laminated thereon, and if necessary, it may not be deteriorated greatly by the action of a developer or remover for removing a photoresist layer which is used for the formation of metal wiring.

A polyimide resin substrate may be suitably used because it has excellent heat resistance and flame resistance, high rigidity, and excellent electrical insulating properties.

In terms of physical properties, a polyimide resin substrate may preferably have a heat shrinkage of 0.05% or less. In addition, it is preferred that a linear expansion coefficient (50° C. to 200° C.) of a polyimide resin substrate is close to that of a metal foil to be laminated thereon. When a copper foil is used as the metal foil, the polyimide resin substrate may preferably have a linear expansion coefficient (50° C. to 200° C.) of from $0.5 \times 10^{-5}$ cm/cm/° C. to $2.8 \times 10^{-5}$ cm/cm/° C.

Furthermore, the polyimide resin substrate may preferably have a heat shrinkage of 0.05% or less, and a linear expansion coefficient (50° C. to 100° C.) close to that of a metal foil to be laminated thereon. When a copper foil is used as the metal foil, the polyimide resin substrate may preferably have a linear expansion coefficient (50° C. to 100° C.) of from 0.5×10⁻⁵ cm/cm/° C. to 2.8×10⁻⁵ cm/cm/° C.

When a heat-resistant resin is used for the polyimide resin substrate, in particular, the polyimide resin substrate may preferably have a heat shrinkage of 0.05% or less, and a linear expansion coefficient (50° C. to 200° C.) close to that of a metal foil to be laminated thereon. When a copper foil is used as the metal foil, the polyimide resin substrate may preferably have a linear expansion coefficient (50° C. to 200° C.) of from $0.5 \times 10^{-5}$ cm/cm/° C. to $2.8 \times 10^{-5}$ cm/cm/° C.

A linear expansion coefficient (50° C. to 200° C.) of a polyimide resin substrate was measured by a thermo-mechanical analyzer (TMA) (mode: tensile mode; load: 4 g; sample piece length: 10 mm; 20° C./min) after a sample piece was heated at 300° C. for 30 min for stress relief.

A heat shrinkage of a polyimide resin substrate was measured in accordance with JIS C2318 after a sample piece was heated at 300° C. for 30 min for stress relief.

A polyimide such as an aromatic polyimide which is prepared from an acid component comprising at least one selected from the group consisting of an acid having a biphenyltetracarboxylic acid backbone and an acid having a pyromellitic acid backbone as a main component, and a diamine component comprising at least one selected from the group consisting of a diamine having a phenylenediamine backbone, a diamine having a diaminodiphenyl ether backbone and a diamine having a biphenyl backbone as a main component may be used for the polyimide resin substrate.

The polyimide resin substrate may be a single-layer or multi-layer film, sheet or plate having one, two or more layers in shape.

Examples of the polyimide resin substrate include, but not limited to, "UPILEX (S, R, VT)" (trademark) from Ube Industries, Ltd.

The polyimide resin substrate may contain a filler such as an inorganic filler and an organic filler, for example.

There are no particular restrictions to the thickness of the polyimide resin substrate, so long as the polyimide resin substrate may be laminated on a metal foil without any trouble, it may be easily produced, it may have good handling properties, and it may sufficiently support a metal foil laminated thereon. The thickness of the polyimide resin substrate may be preferably 1 μm to 500 μm, more preferably 2 μm to 300 μm, further preferably 5 μm to 200 μm, further preferably 7 μm to 175 μm, particularly preferably 8 μm to 100 μm.

In the present invention, a polyimide resin substrate may be used after subjecting at least one surface of the polyimide resin substrate to surface treatment such as corona discharge treatment, plasma treatment, chemical surface roughening treatment, and physical surface roughening treatment. The surface of the polyimide resin substrate to be used may be particularly preferably treated with a silane coupling agent. When the surface of the metal foil is not treated with a silane coupling agent, in particular, the surface of the polyimide resin substrate is preferably subjected to surface treatment, particularly preferably treatment with a silane coupling agent.

Examples of the silane coupling agent for surface treatment of the polyimide resin substrate may include those listed as the silane coupling agent for surface treatment of the metal foil as described above. The surface treatment agent for the polyimide resin substrate may be preferably a silane coupling agent such as an aminosilane coupling agent and an epoxysilane coupling agent.

The term "treatment (surface treatment) with a surface treatment agent such as a silane coupling agent" includes a case in which the surface treatment agent is contained in the surface of the polyimide resin substrate without change, and a case in which the surface treatment agent contained in the polyimide film, for example, has undergone a change, including chemical change, caused by heat treatment at a temperature of from 320° C. to 550° C., for example, in a polyimide or a polyimide precursor, or an organic solution thereof.

When the polyimide resin substrate has inadequate handling properties, e.g. low rigidity, a rigid film or plate, which can be peeled therefrom in later step, may be bonded to the back surface of the polyimide resin substrate for use in the production of a metal foil laminated polyimide resin substrate.

In the present invention, the polyimide resin substrate may be a thermocompression-bondable and/or adhesive resin substrate having two or more layers, which has a heat-resistant layer (Sa1) and a thermocompression-bondable and/or adhesive layer (Sa2), including a layer of an adhesive, on at least one side of the heat-resistant layer. Examples of the layer configuration include Sa2/Sa1, Sa2/Sa1/Sa2, Sa2/Sa1/Sa2/Sa1, and Sa2/Sa1/Sa2/Sa1/Sa2.

The thermocompression-bondable and/or adhesive layer (Sa2) of the polyimide resin substrate is used to be bonded to a metal foil. The thermocompression-bondable and/or adhesive layer (Sa2) may be selected from any thermocompression-bondable layer and any adhesive layer.

In the thermocompression-bondable and/or adhesive resin substrate having two or more layers, the thicknesses of the heat-resistant layer (Sa1) and the thermocompression-bondable and/or adhesive layer (Sa2) may be appropriately selected. In the present invention, however, the thickness of the thermocompression-bondable and/or adhesive layer (Sa2) which is the outermost layer (surface layer) is preferably equal to or greater than the surface roughness (Rzjis) of the surface of the metal foil to be bonded to the polyimide resin substrate, as described above, and it may be preferably 0.5 μm or more, more preferably 1 μm or more, particularly preferably 2 μm or more. In addition, the thickness of the thermocompression-bondable and/or adhesive layer (Sa2) may be preferably 3 μm or less.

In the metal foil laminated polyimide resin substrate, the metal foil may be laminated on the polyimide resin substrate via a polyimide-based adhesive. The adhesive (adhesive layer) to be used may be thermosetting or thermoplastic. Examples of the adhesive include a polyimide resin, a polyimide siloxane-epoxy resin, a polyurethane imide adhesive and any known modified imide adhesive, a polyamide imide resin, a polyester imide resin, a polyether imide resin, a polyimide adhesive, an imide oligomer adhesive, and a polyimide siloxane adhesive. A polyimide adhesive, an imide oligomer adhesive, a polyimide siloxane-epoxy adhesive, a polyurethane imide adhesive or any known modified imide adhesive may be particularly suitably used.

The metal foil laminated polyimide resin substrate of the present invention is characterized in that the surface-treated (roughened) surface of the metal foil is bonded to one side or both sides of the polyimide resin substrate; the present invention is not limited by the process for producing the metal foil laminated polyimide resin substrate.

The metal foil laminated polyimide resin substrate may be, for example, 1) a metal foil laminated polyimide resin substrate wherein a surface-treated surface of a metal foil is bonded to one side or both sides of a polyimide resin substrate directly, or alternatively, via an adhesive;

2) a metal foil laminated polyimide resin substrate wherein a surface-treated surface of a metal foil is bonded to one side or both sides of a polyimide resin substrate directly, or alternatively, via an adhesive by the application of heat;

3) a metal foil laminated polyimide resin substrate wherein a surface-treated surface of a metal foil is bonded to one side or both sides of a polyimide resin substrate directly, or alternatively, via an adhesive by the application of pressure;

4) a metal foil laminated polyimide resin substrate wherein a surface-treated surface of a metal foil is bonded to one side or both sides of a polyimide resin substrate directly, or alternatively, via an adhesive by the application of heat and pressure; or 5) a metal foil laminated polyimide resin substrate obtained by applying an adhesive, a thermocompression-bondable material, a solution containing a polyimide or a polyimide precursor such as a polyamic acid for a polyimide resin substrate onto a surface-treated surface of a metal foil, and then laminating a polyimide resin substrate on the surface-treated surface of the metal foil by the application of heat and/or pressure.

When adequate adhesiveness between the surface of the polyimide resin substrate and the metal foil may not be achieved by the application of pressure, heat, or heat and pressure, the metal foil is preferably laminated on the polyimide resin substrate via an adhesive.

An adhesive or thermocompression-bondable organic material or resin, or a resin for a polyimide resin substrate may be applied onto a polyimide resin substrate and/or a surface-treated surface of a metal foil by any commonly-used method; for example, by a roll coater, a slit coater, and a comma coater.

A heating apparatus, a pressing apparatus, or a pressing and heating apparatus may be used to laminate a metal foil having an adhesive layer or a thermocompression-bondable resin layer thereon and a polyimide resin substrate together, or alternatively, to laminate a metal foil and a polyimide resin substrate having an adhesive layer or a thermocompression-bondable resin layer thereon together. It is preferred that the heating conditions and the pressing conditions are appropriately selected depending on the type of the material to be used. There are no particular restrictions to the method for laminating a metal foil and a polyimide resin substrate, so long as it may be carried out in a continuous mode or in a batch mode. The method may be preferably carried out continuously, using a roll laminator, a double-belt press, or the like.

A polyimide film, which has excellent heat resistance and electrical insulating properties, may be suitably used as the polyimide resin substrate.

A polyimide film as the polyimide resin substrate may preferably have a heat shrinkage of 0.05% or less. In addition, it is preferred that a linear expansion coefficient (50° C. to 200° C.) of a polyimide film is close to that of a metal foil to be laminated thereon. When a copper foil is used as the metal foil, the polyimide resin substrate may preferably have a linear expansion coefficient (50° C. to 200° C.) of from 0.5× $10^{-5}$ cm/cm/° C. to 2.8×$10^{-5}$ cm/cm/° C.

The polyimide film may be a single-layer polyimide film, or a multi-layer laminated polyimide film having two or more polyimide layers. There are no particular restrictions to the type of the polyimide.

A polyimide film may be prepared by a known method. A single-layer polyimide film may be prepared, for example, by (1) flow-casting or applying a solution of a polyamic acid, which is a polyimide precursor, on a support; and then imidizing the polyamic acid; or (2) flow-casting or applying a solution of a polyimide on a support; and then heating the polyimide solution, if necessary.

A multi-layer polyimide film having two or more polyimide layers may be prepared, for example, by (3) flow-casting or applying a solution of a polyamic acid, which is a polyimide precursor, on a support; flow-casting or applying a solution of a polyamic acid, which is a polyimide precursor, on the polyamic acid layer, and repeating the procedure successively, to form two or more polyamic acid layers; and then imidizing the polyamic acids;

(4) flow-casting or applying two or more solutions of polyamic acids, which are polyimide precursors, on a support simultaneously, to form two or more polyamic acid layers; and then imidizing the polyamic acids;

(5) flow-casting or applying a solution of a polyimide on a support; flow-casting or applying a solution of a polyimide on the polyimide layer, and repeating the procedure successively, to form two or more polyimide layers; and then heating the polyimide solutions, if necessary;

(6) flow-casting or applying two or more solutions of polyimides on a support simultaneously, to form two or more polyimide layers; and then heating the polyimide solutions, if necessary; or (7) laminating two or more polyimide films, which are prepared by any one of methods (1) to (6) as described above, directly or via an adhesive.

The polyimide film as the polyimide resin substrate may be a thermocompression-bondable polyimide film having two or more layers, which has a heat-resistant polyimide layer (S1) and a thermocompression-bondable polyimide layer (S2) on at least one side of the heat-resistant polyimide layer (S1). Examples of the layer configuration of the multi-layer polyimide film include S2/S1, S2/S1/S2, S2/S1/S2/S1, and S2/S1/S2/S1/S2.

In the thermocompression-bondable polyimide film, the thicknesses of the heat-resistant polyimide layer (S1) and the thermocompression-bondable polyimide layer (S2) may be appropriately selected. In the present invention, however, the thickness of the thermocompression-bondable polyimide layer (S2) which is the outermost layer (surface layer) is preferably equal to or greater than the surface roughness (Rzjis) of the surface of the metal foil to be bonded to the polyimide resin substrate, as described above, and it may be preferably 0.5 μm to 10 μm, more preferably 1 μm to 7 μm, particularly preferably 2 μm to 5 μm. In addition, the thickness of the thermocompression-bondable polyimide layer (S2) may be preferably 3 μm or less.

The curling of the polyimide film may be reduced when the polyimide film has thermocompression-bondable polyimide layers (S2) on both sides of the heat-resistant polyimide layer (S1) and the thermocompression-bondable polyimide layers (S2) are substantially equal in thickness.

A heat-resistant polyimide for the heat-resistant polyimide layer (S1) in the thermocompression-bondable polyimide film may have at least one of the following features (1) to (4), or at least two of the following features (1) to (4) [combinations of (1) and (2), (1) and (3), (2) and (3), etc.], and particularly preferably have all of the following features.

(1) In the form of a separate polyimide film, the glass transition temperature is 300° C. or higher, preferably 330° C. or higher, and further preferably, a glass transition temperature is undetectable.

(2) In the form of a separate polyimide film, the linear expansion coefficient (50° C. to 200° C.) (MD) is close to a thermal expansion coefficient of a metal foil such as a copper foil to be laminated on the polyimide resin substrate. Specifically, when a copper foil is used as the metal foil, a thermal expansion coefficient of the polyimide resin substrate is preferably $5 \times 10^{-6}$ cm/cm/° C. to $28 \times 10^{-6}$ cm/cm/° C., more preferably $9 \times 10^{-6}$ cm/cm/° C. to $20 \times 10^{-6}$ cm/cm/° C., further preferably $12 \times 10^{-6}$ cm/cm/° C. to $18 \times 10^{-6}$ cm/cm/° C.

(3) In the form of a separate polyimide film, the tensile modulus (MD, ASTM-D882) is 300 kg/mm$^2$ or more, preferably 500 kg/mm$^2$ or more, further preferably 700 kg/mm$^2$ or more.

(4) The heat shrinkage is preferably 0.05% or less.

A polyimide which is prepared from an acid component comprising at least one selected from the group consisting of 3,3',4,4'-biphenyltetracarboxylic dianhydride (s-BPDA), pyromellitic dianhydride (PMDA) and 3,3',4,4'-benzophenone tetracarboxylic dianhydride (BTDA) as a main component, and a diamine component comprising at least one selected from the group consisting of p-phenylenediamine (PPD) and 4,4'-diaminodiphenyl ether (DADE) as a main component may be used for the heat-resistant polyimide layer (S1). The following polyimides, for example, may be suitably used for the heat-resistant polyimide layer (S1).

(1) a polyimide prepared from 3,3',4,4'-biphenyltetracarboxylic dianhydride (s-BPDA), p-phenylenediamine (PPD) and optionally 4,4'-diaminodiphenyl ether (DADE). In this polyimide, a ratio of PPD/DADE (molar ratio) is preferably 100/0 to 85/15.

(2) a polyimide prepared from 3,3',4,4'-biphenyltetracarboxylic dianhydride (s-BPDA), pyromellitic dianhydride (PMDA), p-phenylenediamine (PPD) and 4,4'-diaminodiphenyl ether (DADE). In this polyimide, a ratio of BPDA/PMDA (molar ratio) is preferably 15/85 to 85/15, and a ratio of PPD/DADE (molar ratio) is preferably 90/10 to 10/90.

(3) a polyimide prepared from pyromellitic dianhydride (PMDA), p-phenylenediamine (PPD) and 4,4'-diaminodiphenyl ether (DADE). In this polyimide, a ratio of DADE/PPD (molar ratio) is preferably 90/10 to 10/90.

(4) a polyimide prepared from 3,3',4,4'-benzophenone tetracarboxylic dianhydride (BTDA), pyromellitic dianhydride (PMDA), p-phenylenediamine (PPD) and 4,4'-diaminodiphenyl ether (DADE). In this polyimide, a ratio of BTDA/PMDA (molar ratio) in the acid dianhydride component is preferably 20/80 to 90/10, and a ratio of PPD/DADE (molar ratio) in the diamine component is preferably 30/70 to 90/10.

Other tetracarboxylic dianhydrides and other diamines may be used, so long as the properties of the heat-resistant polyimide would not be impaired.

A heat-resistant polyimide for the heat-resistant polyimide layer (S1 layer) may be synthesized by random polymerization or block polymerization of an acid component and a diamine component, both of which have the final compositions in the above-mentioned range. A heat-resistant polyimide for the heat-resistant polyimide layer (S1 layer) may also be synthesized by preparing two polyamic acids, and then mixing these polyamic acid solutions under the reaction conditions, to form a homogeneous solution.

The heat-resistant polyimide may be prepared as described below. First, a polyamic acid solution is prepared by reacting substantially equimolar amounts of a diamine component and an acid component (tetracarboxylic dianhydride), both of which are described above, in an organic solvent. In the polyamic acid solution, imidization may partially proceed, so long as the polyamic acid solution is homogeneous. Subsequently, the polyamic acid solution thus obtained is used as a dope, and a thin film of the dope is formed, and then heated to evaporate and remove a solvent from the thin film and to imidize the polyamic acid, thereby preparing a heat-resistant polyimide.

In the present invention, a thin film of a dope for a thermocompression-bondable polyimide may be laminated onto a thin film of a dope for a heat-resistant polyimide, followed by simultaneous imidization of these dopes. The process will be described later.

A thermocompression-bondable polyimide for the thermocompression-bondable polyimide layer (S2) is (1) a polyimide which may be thermocompression-bonded to a metal foil. The thermocompression-bondable polyimide may be preferably laminated (thermocompression-bonded) to a metal foil at a temperature of from the glass transition temperature of the polyimide to 400° C.

In addition, a thermocompression-bondable polyimide for the thermocompression-bondable polyimide layer (S2) may preferably have at least one of the following features (2) to (5).

(2) The peel strength between a metal foil and the polyimide (S2) is 0.7 N/mm or more, and the retention rate of the peel strength after heat treatment at 150° C. for 168 hours is 90% or more, further preferably 95% or more, particularly preferably 100% or more.

(3) The glass transition temperature is in the range of 130° C. to 330° C.

(4) The tensile modulus is in the range of 100 kg/mm$^2$ to 700 kg/mm$^2$.

(5) The linear expansion coefficient (50° C. to 200° C.) (MD) is in the range of $13 \times 10^{-6}$ cm/cm/° C. to $30 \times 10^{-6}$ cm/cm/° C.

Various known thermoplastic polyimides may be used as the thermocompression-bondable polyimide for the thermocompression-bondable polyimide layer (S2). The thermocompression-bondable polyimide to be used may be, for example, a polyimide which is prepared from an acid component comprising at least one selected from the group consisting of 2,3,3',4'-biphenyltetracarboxylic dianhydride (a-BPDA), 3,3',4,4'-biphenyltetracarboxylic dianhydride (s-BPDA), pyromellitic dianhydride (PMDA), 3,3',4,4'-benzophenone tetracarboxylic dianhydride (BTDA), 3,3',4,4'-diphenyl sulfone tetracarboxylic dianhydride, 4,4'-oxydiphthalic dianhydride (ODPA), p-phenylene bis(trimellitic acid monoester anhydride), and 3,3',4,4'-ethylene glycol dibenzoate tetracarboxylic dianhydride, for example, preferably an acid component comprising them as a main component, and a diamine component comprising at least one diamine having at least three benzene rings in the main chain, which is selected from the group consisting of 1,4-bis(4-aminophenoxy)benzene, 1,3-bis(4-aminophenoxy)benzene, 1, 3-bis(3-aminophenoxy)benzene, 2,2-bis[4-(4-aminophenoxy)phenyl]propane, 2,2-bis[4-(3-aminophenoxy)phenyl]propane, bis[4-(4-aminophenoxy)phenyl]sulfone, and bis[4-(3-aminophenoxy)phenyl]sulfone, for example, preferably a diamine component comprising them as a main component. The diamine component may comprise a diamine having one or two benzene rings in the main chain, if necessary.

A polyimide which is prepared from an acid component comprising at least one selected from the group consisting of 2,3,3',4'-biphenyltetracarboxylic dianhydride (a-BPDA), 3,3',4,4'-biphenyltetracarboxylic dianhydride (s-BPDA), pyromellitic dianhydride (PMDA) and 3,3',4,4'-benzophenone tetracarboxylic dianhydride (BTDA), and a diamine component comprising at least one selected from the group consisting of 1,4-bis(4-aminophenoxy)benzene, 1,3-bis(4-aminophenoxy)benzene, 1, 3-bis(3-aminophenoxy)benzene and 2,2-bis[4-(4-aminophenoxy)phenyl]propane may be suitably used as the thermocompression-bondable polyimide. In this thermocompression-bondable polyimide, if necessary, the diamine component may comprise a diamine having one or two benzene rings in the main chain, and/or other diamines, and the acid component may comprise other tetracarboxylic dianhydrides and/or tetracarboxylic acid.

A particularly preferable thermocompression-bondable polyimide may be a polyimide prepared from 3,3',4,4'-biphenyltetracarboxylic dianhydride (s-BPDA) and/or 2,3,3',4'-biphenyltetracarboxylic dianhydride (a-BPDA), and a diamine component comprising not less than 80 mol % of 1,3-bis(4-aminophenoxy benzene) (hereinafter, sometimes abbreviated as "TPER"). In this polyimide, a ratio of s-BPDA/a-BPDA (molar ratio) is preferably 100/0 to 5/95. Other tetracarboxylic dianhydrides such as 2,2-bis(3,4-dicarboxyphenyl)propane dianhydride and 2,3,6,7-naphthalene tetracarboxylic dianhydride may be used, so long as the properties of the thermocompression-bondable polyimide would not be impaired.

The thermocompression-bondable polyimide may be prepared as described below. First, a polyamic acid solution is prepared by reacting a diamine component and an acid component, both of which are described above, and optionally another tetracarboxylic dianhydride and another diamine in an organic solvent at a temperature of about 100° C. or lower, preferably from 20° C. to 60° C. Subsequently, the polyamic acid solution thus obtained is used as a dope, and a thin film of the dope is formed, and then heated to evaporate and remove a solvent from the thin film and to imidize the polyamic acid, thereby preparing a thermocompression-bondable polyimide.

A solution of a thermocompression-bondable polyimide in an organic solvent may be prepared as described below. First, the polyamic acid solution, which is prepared as described above, is heated at a temperature of from 150° C. to 250° C. to effect imidization. Alternatively, an imidizing agent is added to the polyamic acid solution, which is prepared as described above, and then the polyamic acid solution is reacted at a temperature of 150° C. or lower, preferably from 15° C. to 50° C. to effect imidization. Subsequently, the thermocompression-bondable polyimide powder is obtained by evaporating the solvent, or alternatively, by precipitating the thermocompression-bondable polyimide in a poor solvent. And then, the powder is dissolved in an organic solvent, thereby preparing a solution of the thermocompression-bondable polyimide in the organic solvent.

In the preparation of the thermocompression-bondable polyimide, a ratio of a diamine (as the number of moles of amino groups) to an acid anhydride (as the total number of moles of acid anhydride groups in a tetracarboxylic dianhydride and a dicarboxylic anhydride) in an organic solvent may be preferably 0.95 to 1.0, particularly preferably 0.98 to 1.0, further preferably 0.99 to 1.0. When a dicarboxylic anhydride is used and reacted for the preparation of the thermocompression-bondable polyimide, the dicarboxylic anhydride may be used in a ratio of 0.05 or less relative to the number of moles of acid anhydride groups in a tetracarboxylic dianhydride.

When a polyamic acid prepared in the synthesis of a thermocompression-bondable polyimide has a very low molecular weight, adhesion strength of a laminate of the thermocompression-bondable polyimide and a metal foil, i.e. a metal foil laminated polyimide resin substrate of the present invention, may be reduced.

For the purpose of preventing gelation of the polyamic acid, a phosphorus-containing stabilizer such as triphenyl phosphite and triphenyl phosphate may be added to the solution in an amount of 0.01 wt % to 1 wt % based on the solid content (polymer) concentration in the polymerization of the polyamic acid.

For the purpose of accelerating imidization, a basic organic compound may be added to the dope. For example, imidazole, 2-imidazole, 1,2-dimethylimidazole, 2-phenylimidazole, benzimidazole, isoquinoline, a substituted pyridine, and the like may be added to the dope in an amount of 0.05 wt % to 10 wt %, particularly 0.1 wt % to 2 wt %, based on the polyamic acid. These compounds may be used in order to avoid insufficient imidization in the formation of the polyimide film at a relatively low temperature.

Furthermore, for the purpose of stabilizing adhesiveness of the polyimide film obtained, an organic aluminum compound, an inorganic aluminum compound, or an organic tin compound may be added to the polyamic acid solution for the thermocompression-bondable polyimide. For example, aluminum hydroxide, aluminum triacetylacetonate, and the like may be added to the polyamic acid solution in an amount of 1 ppm or more, particularly 1 ppm to 1,000 ppm in terms of aluminum metal, based on the polyamic acid.

Examples of the organic solvent to be used for the preparation of the polyamic acid both for the heat-resistant polyimide and for the thermocompression-bondable polyimide, which is prepared from an acid component and a diamine component, include N-methyl-2-pyrrolidone, N,N-dimethylformamide, N, N-dimethylacetamide, N, N-diethylacetamide, dimethyl sulfoxide, hexamethyl phosphoramide, N-methylcaprolactam, and cresol. These organic solvents may be used alone or in combination of two or more.

In the preparation of the heat-resistant polyimide and the thermocompression-bondable polyimide, a dicarboxylic anhydride such as phthalic anhydride and substituted derivative thereof, hexahydrophthalic anhydride and substituted derivative thereof, and succinic anhydride and substituted derivative thereof, particularly phthalic anhydride, may be used for blocking the amine end.

A thermocompression-bondable polyimide film having a thermocompression-bondable polyimide layer (S2) on one side or both sides of a heat-resistant polyimide layer (S1) may be suitably prepared by (i) a method wherein a multi-layer polyimide film is formed by laminating a dope for the heat-resistant polyimide (S1) and a dope for the thermocompression-bondable polyimide (S2) by coextrusion-flow casting method (sometimes referred to as "coextrusion method"), and then drying and imidizing them; or (ii) a method wherein a multi-layer polyimide film is formed by applying a dope for the thermocompression-bondable polyimide (S2) onto one side or both sides of a self-supporting film (gel film), which is prepared by flow-casting a dope for the heat-resistant polyimide (S1) on a support and drying it, and then drying and imidizing them.

A coextrusion method used in the present invention is described in Japanese Laid-open Patent Publication No. 1991-180343 (Japanese Examined Patent Application Publication No. 1995-102661), for example.

There will be described an example of a process for producing a polyimide film having three layers, both sides of which are thermocompression-bondable.

A polyamic acid solution for the heat-resistant polyimide (S1) and a polyamic acid solution for the thermocompression-bondable polyimide (S2) are fed to a three-layer extrusion die and flow-cast on a support such as a stainless specular surface and a stainless belt surface by a three-layer coextrusion method such that the thickness of the heat-resistant polyimide layer (S1 layer) is in the range of 4 μm to 45 μm and the total thickness of the thermocompression-bondable polyimide layers (S2 layers) on both sides of the heat-resistant polyimide layer (S1 layer) is in the range of 1 μm to 20 μm. And then, the flow-cast film is dried at a temperature of from 100° C. to 200° C., thereby producing a self-supporting polyimide film (A) in a semi-cured state or in a dried state at an earlier stage.

In the preparation of the thermocompression-bondable polyimide film, when the flow-cast film is heated at a temperature of higher than 200° C., adhesiveness may be reduced. The term "in a semi-cured state or in a dried state at an earlier stage" means that the film is in a self-supporting state by heating and/or chemical imidization.

The self-supporting polyimide film (A) may preferably contain the solvent and water which has formed in an amount of about 25 wt % to about 60 wt %, particularly preferably 30 wt % to 50 wt %. The self-supporting film may be preferably heated to the temperature for drying/imidization in a relatively short period of time; for example, the self-supporting film may be preferably heated at a rate of 10° C./min or more.

When higher tension is applied to the self-supporting film during drying/imidization, the polyimide film (A) finally obtained may have a lower linear expansion coefficient.

After the drying step for preparing a self-supporting film as described above, continuously or discontinuously, the self-supporting film is dried and heated at a temperature higher than the drying temperature as described above, preferably at a temperature of from 200° C. to 550° C., particularly preferably from 300° C. to 500° C., for about 1 min to 100 min, particularly preferably 1 min to 10 min, while fixing at least one pair of edges of the self-supporting film with a fixing device which is movable therewith, for example. A polyimide film, both sides of which are thermocompression-bondable, is formed by sufficiently removing the solvent, and the like from the self-supporting film and fully imidizing the polymer constituting the film such that the polyimide film finally obtained preferably has a volatile content (the amount of the organic solvent, water which has formed, and the like in the film) of 1 wt % or less.

A preferable device for fixing a self-supporting film as described above may be, for example, a device wherein a pair of belts or chains having many equally spaced pins or grippers, for example, are disposed along both edges of a self-supporting film, which is fed continuously or intermittently, in the length direction, and fix and move with the self-supporting film continuously or intermittently. In addition, a device for fixing a self-supporting film as described above may be a device which stretch and/or shrink the film in the width direction or in the length direction during heat treatment at an appropriate stretch or shrink ratio (particularly preferably about 0.5% to about 5%).

The polyimide film, both sides of which are thermocompression-bondable, obtained in the step as described above may be further heated at a temperature of from 100° C. to 400° C. preferably for 0.1 min to 30 min under no tension or a low tension, preferably under a low tension of 4 N or lower, particularly preferably 3 N or lower, to provide a polyimide film, both sides of which are thermocompression-bondable, having improved dimensional stability.

The long polyimide film, both sides of which are thermocompression-bondable, thus obtained may be wound into a roll by any known method.

In the present invention, the surface of the polyimide resin substrate may be preferably treated with a silane coupling agent, as described above. In the case where the surface of the polyimide film is treated with a silane coupling agent, the treatment with the silane coupling agent may be preferably conducted during the production of the polyimide film. For example, a solution containing a silane coupling agent may be preferably applied onto the self-supporting polyimide film (A) as described above.

There will be described an example of a process for producing a metal foil laminated polyimide resin substrate comprising a polyimide film, particularly a polyimide film having a heat-resistant polyimide layer (S1) and a thermocompression-bondable polyimide layer (S2) on at least one side of the heat-resistant polyimide layer (S1) as described above, as a polyimide resin substrate.

A metal foil laminated polyimide resin substrate may be prepared, for example, by laminating a surface-treated surface of a metal foil onto the heat-resistant polyimide (S1) on one side or both sides of the polyimide resin substrate via an adhesive.

Using a polyimide film having a thermocompression-bondable polyimide layer (S2) on both sides or one side as described above, a metal foil laminated polyimide resin substrate may be preferably prepared by laminating a surface-treated surface of a metal foil onto the thermocompression-bondable polyimide layer (S2).

Examples of the process for producing a metal foil laminated polyimide resin substrate wherein a metal foil is laminated on both sides of a thermocompression-bondable polyimide film may include the following processes.

1) A long metal foil, a long thermocompression-bondable polyimide film and a long metal foil are laminated in this order, and fed to a thermocompression-bonding apparatus (a heating and pressing apparatus). The metal foils and the thermocompression-bondable polyimide film may be preferably preheated at a temperature of from about 150° C. to about 250° C., particularly at a temperature of higher than 150° C. but not higher than 250° C., for about 2 sec to about 120 sec, preferably in-line just before introducing into the thermocompression-bonding apparatus, using a pre-heating apparatus such as a hot-air blower and an infrared heater.

2) A three-layer laminate of a metal foil, a thermocompression-bondable polyimide film and a metal foil (metal foil/polyimide/metal foil) is heated and pressed at a temperature equal to or higher than the temperature higher by 20° C. than the glass transition temperature of the polyimide (S2), but not higher than 400° C., particularly at a temperature equal to or higher than the temperature higher by 30° C. than the glass transition temperature of the polyimide (S2), but not higher than 400° C., in the thermocompression-bonding zone, using a pair of press rolls or a double-belt press.

3) In the case of a double-belt press, in particular, after the thermocompression-bonding, the laminate is cooled under pressure, preferably to a temperature equal to or lower than the temperature lower by 20° C. than the glass transition temperature of the polyimide (S2), particularly to a temperature equal to or lower than the temperature lower by 30° C. than the glass transition temperature of the polyimide (S2), in the cooling zone, thereby laminating the metal foils onto both sides of the polyimide film, and then the laminate is wound into a roll.

Thus a double-sided metal foil laminated polyimide film in roll form may be prepared.

Using a polyimide film having a thermocompression-bondable polyimide layer (S2) on one side, a metal foil laminated polyimide resin substrate wherein a metal foil is laminated on one side of a polyimide film (single-sided metal foil laminated polyimide film) may be prepared by laminating a surface-treated surface of a metal foil onto the thermocompression-bondable polyimide layer (S2) in the same way as described above.

In addition, a metal foil laminated polyimide resin substrate wherein a metal foil is laminated on one side of a polyimide film (single-sided metal foil laminated polyimide resin substrate) may be prepared using a polyimide film having a thermocompression-bondable polyimide layer (S2) on both sides as described above.

Examples of the process for producing a single-sided metal foil laminated polyimide resin substrate may include the following processes.

1) A long metal foil, a long thermocompression-bondable polyimide film and a long non-thermocompression-bondable film, preferably a polyimide film (UPILEX S and UPILEX RN from Ube Industries, Ltd, for example), are laminated in this order, and fed to a thermocompression-bonding apparatus (a heating and pressing apparatus). The metal foil and the films may be preferably preheated at a temperature of from about 150° C. to about 250° C., particularly at a temperature of higher than 150° C. but not higher than 250° C., for about 2 sec to about 120 sec, preferably in-line just before introducing into the thermocompression-bonding apparatus, using a pre-heating apparatus such as a hot-air blower and an infrared heater.

2) A three-layer laminate of a metal foil, a thermocompression-bondable polyimide film and a non-thermocompression-bondable film (metal foil/polyimide/polyimide (non-thermocompression-bondable film)) is heated and pressed at a temperature equal to or higher than the temperature higher by 20° C. than the glass transition temperature of the polyimide (S2), but not higher than 400° C., particularly at a temperature equal to or higher than the temperature higher by 30° C. than the glass transition temperature of the polyimide (S2), but not higher than 400° C., in the thermocompression-bonding zone, using a pair of press rolls or a double-belt press.

3) In the case of a double-belt press, in particular, after the thermocompression-bonding, the laminate is cooled under pressure, preferably to a temperature equal to or lower than the temperature lower by 20° C. than the glass transition temperature of the polyimide (S2), particularly to a temperature equal to or lower than the temperature lower by 30° C. than the glass transition temperature of the polyimide (S2), in the cooling zone, thereby laminating the metal foil and the non-thermocompression-bondable film onto the thermocompression-bondable polyimide film, and then the laminate is wound into a roll.

Thus a single-sided metal foil laminated polyimide film in roll form may be prepared.

In the process as described above, the preheating prior to the thermocompression-bonding allows prevention of defects in appearance of the laminate after the thermocompression-bonding, which is due to foaming caused by water and the like in the polyimide, and prevention of foaming caused by immersion in a solder bath for forming an electronic circuit, leading to the reduction in product yield. It is impractical to place a whole thermocompression-bonding apparatus in a heating furnace, because the thermocompression-bonding apparatus to be used is substantially limited to a compact one, leading to the restriction to the shape of the metal foil laminated polyimide film. If out-line preheating is conducted, a polyimide may absorb water before lamination, which result in defective appearance of the laminate after the thermocompression-bonding due to foaming, and reduction in solder heat resistance.

A preferable double-belt press may be a hydraulic-pressing type using a heat medium, which is capable of conducting high-temperature heating/cooling under pressure.

When a metal foil is laminated onto a polyimide film having a thermocompression-bondable polyimide layer on both sides or one side by thermocompression-bonding/cooling under pressure, using a double-belt press, the take-off speed may be preferably 1 m/min or higher, and there may be provided a long and wide metal foil laminated polyimide film having a width of about 400 mm or more, particularly about 500 mm or more, which has high adhesive strength (i.e. high peel strength between the metal foil and the polyimide layer) and such good appearance that substantially no wrinkles are observed in the metal foil surface.

It is preferred that one or more combinations of a thermocompression-bondable polyimide film and a metal foil, together with two protective films, each of which is placed between the outermost layer and the belt, are fed and laminated by thermocompression-bonding/cooling under pressure so as to mass-produce a double-sided or single-sided metal foil laminated polyimide film having good appearance. There are no particular restrictions to the material for the protective film, so long as it is non-thermocompression-bondable and has excellent surface smoothness. Preferable examples of the protective film include a metal foil such as a copper foil, a stainless steel foil and an aluminum foil, and a highly heat-resistant polyimide film (UPILEX S from Ube Industries, Ltd, for example) which has a thickness of about 5 μm to about 125 μm.

There will be described a wiring board which is prepared from a metal foil laminated polyimide resin substrate of the present invention.

A metal wiring may be formed on a polyimide resin substrate, using a metal foil laminated polyimide resin substrate wherein a metal foil is laminated on at least one side of a polyimide resin substrate as described above.

A metal wiring may be formed by partially removing a metal foil which is laminated on a polyimide resin substrate by etching to form a wiring pattern. A metal foil may be etched by any known method; for example, by etching with an etching solution (etchant), etching with laser, and the like. In the present invention, wet etching with an etchant may be suitably conducted.

Any known etchant may be used for etching a metal foil. Examples of the etchant include an aqueous solution of potassium ferricyanide, an aqueous solution of iron chloride, an aqueous solution of copper chloride, an aqueous solution of ammonium persulfate, an aqueous solution of sodium persulfate, a hydrogen peroxide solution, an aqueous solution of hydrofluoric acid, and combinations thereof.

The etching conditions may be appropriately selected depending on the type of the etchant to be used, and the like.

The wiring board of the present invention may preferably comprise a metal wiring with a pitch of 80 μm or less, more preferably 50 μm or less, more preferably 40 μm or less, further preferably 30 μm or less, particularly preferably 20 μm or less.

For a wiring board having a metal wiring which is formed by etching the metal foil, the surface of the polyimide resin substrate which is exposed by removing the metal foil may be cleaned with an etchant (A) capable of removing a rust inhibitor metal component. The rust inhibitor metal component is a component which is deposited on a surface of a metal foil for rust-proofing, and include chromium, nickel, zinc and other rust inhibitor components.

There are no particular restrictions to the etchant (A), so long as it is capable of removing a rust inhibitor component faster than a main metal component of a metal foil (that is a metal wiring). When a copper foil is used as the metal foil, the etchant (A) may be an acid etching solution containing hydrochloric acid, or a basic etching solution containing potassium ferricyanide or a permanganate, for example.

Specific examples of the etchant (A) to be used when the metal used in the surface treatment is Ni, Cr or Ni—Cr alloy include known etchants for Ni—Cr alloy (Ni—Cr seed layer remover) such as Melstrip NC-3901 from Meltex Inc., ADEKA Remover NR-135 from ADEKA Corporation, and FLICKER-MH from Nihon Kagaku Sangyo Co., Ltd., for example.

The conditions of cleaning with an etchant (A) may be appropriately selected depending on the type of the etchant to be used. The cleaning may be preferably conducted by immersion (dipping) or spraying at a temperature of from 30° C. to 60° C., more preferably from 40° C. to 60° C., for 0.3 min to 20 min, more preferably 0.5 min to 10 min, particularly preferably 1 min to 7 min.

In the wiring board having the metal wiring which is formed by etching the metal foil on one side or both sides of the metal foil laminated polyimide resin substrate of the present invention, at least a portion of the metal wiring may be plated with a metal. As an example of metal plating for a metal wiring board, which has a copper wiring, a plated metal-wiring board may be produced by plating the copper wiring with a metal such as tin, gold and silver after cleaning the copper wiring with an etchant (A), if necessary.

An IC chip, another metal wiring, and the like may be directly mounted on the side of the wiring board in which the metal wiring is formed.

In addition, an adhesive organic material layer may be laminated on the side of the wiring board in which the metal wiring is formed. Furthermore, an IC chip, another metal wiring, another polyimide resin substrate, and the like may be bonded onto the side of the wiring board in which the metal wiring is formed via an adhesive organic material layer such as an anisotropic conductive film (ACF).

The adhesive organic material layer acts as at least one of a conductive layer, an insulating layer, a protective layer, an adhesion layer, a sealing layer, and a seal layer, for example. The organic material layer may be formed using a liquid or a solid. Examples of the adhesive organic material include epoxy-, acrylic-, urethane-, siloxane- and imide-based materials. Any known adhesive organic material, including materials having thermoplastic properties for application, and materials having thermoplastic properties and thermosetting properties for application, may be used for the adhesive organic material layer.

Examples of the adhesive organic material layer include an anisotropic conductive film (ACF), a bonding sheet, a resist material, and a sealing material.

The adhesive organic material layer may be formed on the side of the wiring board, in which the metal wiring is formed, by a known method; for example, by (1) applying a liquid organic material, or a solution of an organic material on the side of the wiring board in which the metal wiring is formed, and then heating it;

(2) laminating a sheet to be an organic material layer on the side of the wiring board in which the metal wiring is formed, and then heating and pressing the laminate, or alternatively, heating and pressing the laminate in a vacuum; or (3) laminating a sheet to be an organic material layer on the side of the wiring board in which the metal wiring is formed, pressing the laminate, or alternatively, pressing the laminate in a vacuum, and then heating it.

The metal foil laminated polyimide resin substrate of the present invention may have adhesion strength between the metal foil and the polyimide resin substrate adequate for the intended use. The adhesion strength (peel strength) between the metal foil and the polyimide resin substrate may be preferably 0.90 N/mm or more, more preferably 1.00 N/mm or more, further preferably 1.10 N/mm or more, particularly preferably 1.20 N/mm or more. A metal foil, or both a metal foil and a polyimide resin substrate may be preferably selected such that the adhesion strength between the metal foil and the polyimide resin substrate may be in the above-mentioned range.

The metal foil laminated polyimide resin substrate of the present invention, and a wiring board produced therefrom may be used as a substrate for a flexible circuit board, a build-up circuit board, and an IC carrier tape, in any electronics field such as a computer, a terminal device, a telephone, a communication device, a measurement control device, a camera, a clock or a watch, an automobile, an office equipment, a home electric appliance, an aircraft instrument, and a medical device.

EXAMPLES

The present invention will be described in more detail below with reference to the Examples. However, the present invention is not limited to the following Examples.

A copper foil surface, adhesion strength and filling characteristics of a copper foil laminated polyimide film were evaluated as follows.

(Method for Evaluating a Surface of a Copper Foil)

1) Evaluation of a Surface Roughness (Rzjis)

A surface roughness was measured in accordance with JIS-B0601, using a stylus type surface roughness meter (made by Kosaka Laboratory Ltd.; trade name: SEF-30D) equipped with a diamond stylus with a tip "r" (radius) of 2 μm. The measurement was conducted at 20 points, and an average of the measured values was defined as a surface roughness (Rzjis).

2) Evaluation of a Three-Dimensional Area (Three-Dimensional Surface Area)

A surface area was three-dimensionally measured for a two-dimensional region with a surface area of 6550 μm$^2$ in the surface of the copper foil to be bonded to the polyimide film (hereinafter, also referred to as "deposition surface"), using an ultradeep color 3D shape measuring microscope VK-9500 (laser used: violet laser with a visible light threshold wavelength of 408 nm) made by Keyence Corporation.

The surface of the copper foil (unroughened copper foil) used in Experimental Examples 1-8 to be bonded to the polyimide film had a three-dimensional area (a) of 6588 μm$^2$ (before surface roughening). The surface of the copper foil (unroughened copper foil) used in Experimental Example 9 to be bonded to the polyimide film had a three-dimensional area (a) of 8512 μm$^2$ (before surface roughening).

3) Measurement of an L Value

An L value of the surface of the copper foil to be bonded to the polyimide film was measured, using a spectrocolorimeter SE2000 made by Nippon Denshoku Industries Co. Ltd.

4) Measurement of Amounts of Rust Inhibitor Components (Amounts of Zinc, Nickel and Chromium)

The copper foil was cut into a piece of the predetermined size, and only the surface of the copper foil to be bonded to the polyimide film was dissolved in an oxidizing acid solution to elute rust inhibitor components, thereby preparing a solution for measurement. The concentrations of rust inhibitor components in the solution were measured, using an ICP emission spectrophotometer, and amounts of rust inhibitor components per unit area (1 m$^2$) were calculated from the results.

(Method for Evaluating Adhesion Strength of a Copper Foil Laminated Polyimide Film)

A 90° peel strength was measured in a normal-state in accordance with JIS-C6471 Method A to evaluate adhesion strength between the copper foil and the polyimide film in the double-sided copper foil laminated polyimide film. The measurement was conducted for 4 samples, and an average of the measured values in a stable range except overshoot at the initiation of measurement, for example, was defined as adhesion strength. A tensile tester made by TS Engineering Inc. (Model: AC-20C-SL) was used.

(Method for Evaluating Filling Characteristics of a Copper Foil Laminated Polyimide Film)

The double-sided copper foil laminated polyimide film was cut into a sample with a size of 540 mm (full width)×100 mm. The sample was immersed in a solution of ferric chloride, which was an etchant for copper, and the copper foil was fully removed by etching. And then, the sample was washed with water, and naturally dried, to prepare a polyimide film wherein the copper foil was fully removed by etching in the copper foil laminated polyimide film. The shape of the replica formed in the polyimide film surface was observed using a stereomicroscope, and a spot which was judged as being abnormal from a difference in hue by visual observation was marked. And then, the marked spot was micrographed at a magnification of 100 using a scanning electron microscope (SEM), and filling characteristics of the copper foil laminated polyimide film was evaluated by visual observation of the SEM image.

The criteria of filling characteristics were as follows.

○: No unfilled part without a replica shape was clearly observed by visual observation of the SEM photograph.

×: At least one unfilled part without a replica shape was clearly observed by visual observation of the SEM photograph.

Experimental Examples 1-8

Preparation of Surface-Treated Copper Foils A-H

A deposition surface of an unroughened electrolytic copper foil (thickness: 9 μm; surface roughness (Rzjis) of the deposition surface: 0.7 μm) having the properties as described below was subjected to surface roughening, rust-proofing, and surface treatment with a silane coupling agent, each of which is described below, and eight different types of surface-treated copper foils (A-H) (roughened copper foils) were prepared as a copper foil to be bonded to a thermocompression-bondable polyimide. The conditions of surface roughening and rust-proofing are shown in Table 1. The results of measurements of amounts of rust inhibitor components in the surface-treated copper foils (roughened copper foils) are shown in Table 2. The results of evaluations of the surfaces of the surface-treated copper foils to be bonded to the polyimides are shown in Table 3.

(Properties of the Unroughened Electrolytic Copper Foil)
Thickness: 9 μm
Surface roughness (Rzjis) of the deposition surface: 0.7 μm
Surface area of a two-dimensional region with a surface area of 6550 μm² in the deposition surface before surface roughening, which is determined by a laser method (three-dimensional area; a): 6588 μm²

(Surface Roughening)

First, a deposition surface of an unroughened electrolytic copper foil was subjected to surface roughening. As the surface roughening, fine copper particles as roughening particles were formed and attached on the deposition surface of the electrolytic copper foil by copper plating in two steps.

In the first step, copper particle cores were formed on the surface of the electrolytic copper foil by electrolysis under the conditions wherein the first copper electrolyte solution containing 10 g/L of copper and 100 g/L of free sulfuric acid was used, the electrolyte solution temperature was 30° C., the electrolytic copper foil was used as a cathode, and the current density was shown in Table 1. Subsequently, in the second step, roughening particles in the desired shape were formed by plating or by electrolysis under the conditions wherein the second copper electrolyte solution containing 70 g/L of copper and 150 g/L of free sulfuric acid was used, the electrolyte solution temperature was 45° C., the electrolytic copper foil after the first step was used as a cathode, and the current density was shown in Table 1, whereby the copper particle cores were plated with copper to smooth out and give a desired shape to the fine copper particle.

(Rust-Proofing)

Subsequently, both surfaces of the roughened electrolytic copper foil were subjected to inorganic rust-proofing as follows.

First, a zinc-nickel alloy layer was formed by electrolysis under the conditions wherein a solution (pyrophosphoric acid bath) containing 80 g/L of potassium pyrophosphate, 0.2 g/L of zinc and 2 g/L of nickel was used, the solution temperature was 40° C., and the current density was shown in Table 1.

After rust-proofing with zinc-nickel alloy, a chromate layer was formed by electrolysis under the conditions wherein a solution at pH 12 containing 1 g/L of chromic acid was used, and the solution temperature was 25° C.

(Surface Treatment with a Silane Coupling Agent)

After the completion of the rust-proofing as described above, the roughened electrolytic copper foil was washed with water, and a silane coupling agent solution was sprayed onto the deposition surface of the electrolytic copper foil by showering in a chamber for surface treatment with a silane coupling agent immediately, to attach the silane coupling agent onto the rust-proofing layer (chromate layer) on the deposition surface. The silane coupling agent solution was an aqueous solution of aminopropyl trimethoxy silane with a concentration of 3 g/L, which was prepared using pure water as a solvent.

Finally, after the completion of the treatment with the silane coupling agent, water on the electrolytic copper foil was vaporized, using an electric heater.

Thus eight different types of surface-treated copper foils (A-H) with a thickness of 9 μm were prepared.

Experimental Example 9

Preparation of a Surface-Treated Copper Foil I

A deposition surface of a VLP copper foil from Mitsui Mining And Smelting Company, Limited (thickness: 9 μm; surface roughness (Rzjis) of the deposition surface: 2.0 μm; three-dimensional area: 8512 μm²) was subjected to surface roughening, rust-proofing, and surface treatment with a silane coupling agent in the same way as in Experimental Examples 1-8, and a surface-treated copper foil (I) (roughened copper foil) were prepared as a copper foil to be bonded to a thermocompression-bondable polyimide. The conditions of surface roughening and rust-proofing are shown in Table 1. The results of measurements of amounts of rust inhibitor components in the surface-treated copper foil (roughened copper foil) are shown in Table 2. The results of evaluations of the surface of the surface-treated copper foil to be bonded to the polyimide are shown in Table 3.

(Properties of the Unroughened VLP Copper Foil)
Thickness: 9 μm
Surface roughness (Rzjis) of the deposition surface: 2.0 μm
Surface area of a two-dimensional region with a surface area of 6550 μm² in the deposition surface before surface roughening, which is determined by a laser method (three-dimensional area; a): 8512 μm²

Experimental Example 10

Preparation of a Dope for a Heat-Resistant Polyimide S1

To N-methyl-2-pyrrolidone were added p-phenylenediamine (PPD) and 3,3',4,4'-biphenyltetracarboxylic dianhydride (s-BPDA) in a molar ratio of 1000:998 such that a monomer concentration was 18% (by weight, the same shall apply hereinafter), and then the mixture was reacted at 50° C. for 3 hours. The polyamic acid solution thus obtained had a solution viscosity of about 1680 poise at 25° C.

Experimental Example 11

Preparation of a Dope for a Thermocompression-Bondable Polyimide S2

To N-methyl-2-pyrrolidone were added 1,3-bis(4-aminophenoxy) benzene (TPE-R), 2,3,3', 4'-biphenyltetracarboxylic dianhydride (a-BPDA) and 3,3',4,4'-biphenyltetracarboxylic dianhydride (s-BPDA) in a molar ratio of 1000:200:800 such that a monomer concentration was 18%, and further triphenyl phosphate was added in an amount of 0.5% by weight relative to the monomers, and then the mixture was reacted at 40° C. for 3 hours. The polyamic acid solution thus obtained had a solution viscosity of about 1680 poise at 25° C.

Experimental Example 12

Preparation of Thermocompression-Bondable Multi-Layer Polyimide Films A1 and A2

Using a film-forming machine equipped with a three-layer extrusion die (multi-manifold type die), the polyamic acid solutions prepared in Experimental Examples 10 and 11 were flow-cast on a metal support, with varying a thickness of the three-layer extrusion die, and then continuously dried under hot air at 140° C. and peeled from the support, to form a self-supporting film. The self-supporting film was gradually heated from 150° C. to 450° C. in a heating furnace for solvent removal and imidization. Thus two long three-layer polyimide films with different thicknesses were prepared and wound into a roll.

The three-layer polyimide films (layer configuration: S2/S1/S2) thus obtained had the following properties.

(Properties of the Thermocompression-Bondable Multi-Layer Polyimide Film A1)
Thickness configuration: 3 μm/9 μm/3 μm (total: 15 μm)
Glass transition temperature of the S2 layer: 240° C.
Glass transition temperature of the S1 layer:
  Tg was not clearly observed at a temperature of 300° C. or higher.
Linear expansion coefficient (50° C. to 200° C.):
  MD 19 ppm/° C., TD 18 ppm/° C.,
Mechanical properties (Test method: ASTM-D882)
  1) Tensile strength: MD, TD 520 MPa
  2) Elongation percentage: MD, TD 90%
  3) Tensile modulus: MD, TD 7200 MPa
Electrical properties (Test method: ASTM-D149)
  1) Dielectric breakdown voltage: 4.9 kV
(Properties of the Thermocompression-Bondable Multi-Layer Polyimide Film A2)
Thickness configuration: 4 μm/17 μm/4 μm (total: 25 μm)
Glass transition temperature of the S2 layer: 240° C.
Glass transition temperature of the S1 layer:
  Tg was not clearly observed at a temperature of 300° C. or higher.
Linear expansion coefficient (50° C. to 200° C.):
  MD 19 ppm/° C., TD 17 ppm/° C.,
Mechanical properties (Test method: ASTM-D882)
  1) Tensile strength: MD, TD 520 MPa
  2) Elongation percentage: MD, TD 100%
  3) Tensile modulus: MD, TD 7100 MPa
Electrical properties (Test method: ASTM-D149)
  1) Dielectric breakdown voltage: 7.2 kV

Examples 1-7, Comparative Example 1

Preparation of Double-Sided Copper Foil Laminated Polyimide Films

The three-layer polyimide film A1, which was preheated in-line by hot air at 200° C. for 30 sec immediately before being fed to a double-belt press, and two surface-treated electrolytic copper foils (thickness: 9 μm) shown in Table 3, each of which was laminated onto the polyimide film A1, were fed to a heating zone or thermocompression-bonding zone (the highest heating temperature: 330° C.) and then to a cooling zone (the lowest cooling temperature: 180° C.) to laminate the copper foils onto the polyimide film A1 by continuous thermocompression-bonding and cooling in which the thermocompression-bonding pressure was 3.9 MPa, and the thermocompression-bonding time was 2 min. Thus eight different types of double-sided copper foil laminated polyimide films (width: 540 mm; length: 30 m) were prepared and wound into a roll.

All of the double-sided copper foil laminated polyimide films thus obtained were double-sided copper foil laminates of copper foil/polyimide film A1/copper foil, and the same copper foils (shown in Table 3) were laminated on both sides of the polyimide film.

The double-sided copper foil laminated polyimide films thus obtained were evaluated for adhesion strength between the copper foil and the polyimide film, and the filling characteristics between the copper foil and the polyimide. The results are shown in Table 3.

(Preparation of Polyimide Films after Copper Removal)
The double-sided copper foil laminated polyimide film in roll form thus obtained was cut into a sample with a size of 10 cm×10 cm. The sample was immersed in a solution of ferric chloride, which was an etchant for copper, (temperature: 30° C.) for 30 min and the copper foil was fully removed by etching. And then, the polyimide film obtained by fully removing copper in the copper foil laminated polyimide film by etching was washed with water. Subsequently, the polyimide film was immersed in a solution of FLICKER-MH (Nihon Kagaku Sangyo Co., Ltd.), which was a Ni—Cr seed layer remover, (temperature: 30° C.) for 20 min. And then, the polyimide film was washed with water, and immersed in a 3 vol % hydrochloric acid solution (room temperature: about 20° C.) for 30 sec. Thus the polyimide film after removing copper by etching, and washed with the Ni—Cr seed layer remover was prepared.

(Preparation of an Adhesive Sheet)
In 25 g of a mixed solvent of toluene/methyl ethyl ketone (1 parts by volume/1 parts by volume) was dissolved 25 g of Epicoat 1009 (Japan Epoxy Resins Co., Ltd.), and then to the mixture were added 25 g of a latent curing agent HX3941HP (Asahi Kasei Corporation) and 0.5 g of a silane coupling agent KBM-403 (Shin-Etsu Chemical Co., Ltd.), to prepare a dope. The dope thus obtained was applied to a mold-release film and dried at 80° C. for 5 min, to prepare an epoxy bonding sheet (thickness: about 30 μm).

(Preparation of a Laminated Sheet in which the Adhesive Sheet is Laminated on the Surface of the Polyimide Film after Removal of the Copper Foil)

The polyimide film after removing copper by etching and the epoxy bonding sheet were directly laminated and pressed by a pressure of 30 kgf/cm² at a temperature of 170° C. for 5 min, using a hot-press machine (MP-WNH made by TOYO SEIKI), to prepare a laminated sheet.

The laminated sheet thus obtained was subjected to moist heat treatment (treatment conditions: temperature: 105° C.; humidity: 100% RH; treatment time: 12 hr), and then 90° peel strength was measured as described below. The results are shown in Table 3.

(Method for Measuring 90° Peel Strength of a Laminated Sheet)

The bonding sheet side of the laminated sheet, in which the epoxy bonding sheet was laminated on the polyimide film, was fixed to a support fitting for 90° peel strength measurement with a double-faced tape. And then, 90° peel strength was measured while grasping the polyimide film in the laminated sheet, using a tensile tester made by TS Engineering Inc. (Model: AC-20C-SL). The measurement was conducted for 4 samples, and an average of the measured values in a stable range except overshoot at the initiation of measurement, for example, was defined as 90° peel strength. The measurement conditions were as follows: temperature: 23° C.; humidity: 65%; sample size: about 50 mm (tensile direction)×about 2 mm (width); tensile speed: 50 mm/min; peeling length: 20 mm or more.

Comparative Example 2

A double-sided copper foil laminated polyimide film in roll form (width: 540 mm; length: 30 m) was prepared in the same way as in Example 1, except that the surface-treated copper foils I were used as surface-treated electrolytic copper foils (thickness: 9 μm) as shown in Table 3, and the three-layer polyimide film A2 was used as a polyimide film. Furthermore, a laminated sheet in which the adhesive sheet is laminated on the surface of the polyimide film after removing copper foil by etching from the double-sided copper foil laminated polyimide film was prepared in the same way as in Example 1. The double-sided copper foil laminated polyimide film and the laminated sheet thus obtained were evaluated in the same way as in Example 1. The results are shown in Table 3.

TABLE 1

| Surface-treated copper foil | Current density for surface roughening (Anode current density: A/dm²) | | Current density for rust-proofing (Anode current density: A/dm²) |
|---|---|---|---|
| | 1st step | 2nd step | |
| Experimental Example 1 | A | 26 | 22 | 0.5 |
| Experimental Example 2 | B | 29 | 22 | 0.5 |
| Experimental Example 3 | C | 29 | 22 | 0.5 |
| Experimental Example 4 | D | 31 | 22 | 0.5 |
| Experimental Example 5 | E | 33 | 22 | 0.5 |
| Experimental Example 6 | F | 31 | 22 | 0.5 |
| Experimental Example 7 | G | 33 | 22 | 0.5 |
| Experimental Example 8 | H | 20 | 20 | 0.3 |
| Experimental Example 9 | I | 20 | 38 | 0.5 |

TABLE 2

| | Surface-treated copper foil | Rust inhibitor component amount (mg/m²) | | | |
|---|---|---|---|---|---|
| | | Cr | Zn | Ni | Zn + Ni |
| Experimental Example 1 | A | 2.7 | 12 | 46 | 58 |
| Experimental Example 2 | B | 3.2 | 12 | 51 | 63 |
| Experimental Example 3 | C | 3.2 | 11 | 46 | 57 |
| Experimental Example 4 | D | 3.8 | 11 | 51 | 62 |
| Experimental Example 5 | E | 4.6 | 12 | 50 | 62 |
| Experimental Example 6 | F | 3.8 | 11 | 50 | 61 |
| Experimental Example 7 | G | 4.6 | 10 | 52 | 62 |
| Experimental Example 8 | H | 2.0 | 4 | 21 | 25 |
| Experimental Example 9 | I | 3.2 | 11 | 46 | 57 |

TABLE 3

| | Electrolytic copper foil | | | | | |
|---|---|---|---|---|---|---|
| | | Surface | | Surface area | | |
| | Surface-treated copper foil | roughness Rzjis n = 20 (μm) | Lightness L value | Three-dimensional area (A) (μm²) | Surface area ratio (B) | Surface area ratio (b/a) |
| Example 1 | A | 2.0 | 56.6 | 10275 | 1.57 | 1.56 |
| Example 2 | B | 2.3 | 52.8 | 11351 | 1.73 | 1.72 |
| Example 3 | C | 2.1 | 56.4 | 11465 | 1.75 | 1.74 |
| Example 4 | D | 2.2 | 50.7 | 12139 | 1.85 | 1.84 |
| Example 5 | E | 1.7 | 48.2 | 12250 | 1.87 | 1.86 |
| Example 6 | F | 2.6 | 52.8 | 13045 | 1.99 | 1.98 |
| Example 7 | G | 2.3 | 49.9 | 13380 | 2.04 | 2.03 |
| Comparative Example 1 | H | 0.9 | 64.3 | 8040 | 1.23 | 1.22 |
| Comparative Example 2 | I | 3.2 | 58.2 | 13099 | 2.00 | 1.54 |

TABLE 3-continued

|  | Evaluation of copper foil laminated polyimide film | | Evaluation of laminated sheet |
| --- | --- | --- | --- |
|  | Adhesion strength (N/mm) | Filling characteristics | Peel strength (N/mm) |
| Example 1 | 1.23 | ○ | 0.39 |
| Example 2 | 1.24 | ○ | 0.53 |
| Example 3 | 1.33 | ○ | 0.46 |
| Example 4 | 1.26 | ○ | 0.51 |
| Example 5 | 1.16 | ○ | 0.58 |
| Example 6 | 1.33 | x | 0.52 |
| Example 7 | 1.22 | ○ | 0.52 |
| Comparative Example 1 | 1.24 | ○ | 0.16 |
| Comparative Example 2 | 1.18 | — | 0.20 |

In Table 3, a three-dimensional surface area (A) is a surface area of a two-dimensional region with a surface area of 6550 $\mu m^2$ in a surface-treated copper foil after surface roughening, which is determined by a laser method (three-dimensional area). A surface area ratio (B) is a ratio [A/6550] of a surface area of a two-dimensional region with a surface area of 6550 $\mu m^2$ in a surface-treated copper foil after surface roughening, which is determined by a laser method (three-dimensional area; A) to the area of the two-dimensional region (6550 $\mu m^2$). A surface area ratio (b/a) is a ratio [b/a] of a surface area of a two-dimensional region with a surface area of 6550 $\mu m^2$ in a surface-treated copper foil after surface roughening, which is determined by a laser method (three-dimensional area; b=A) to a surface area of a two-dimensional region with a surface area of 6550 $\mu m^2$ in a copper foil before surface roughening (unroughened copper foil), which is determined by a laser method (three-dimensional area; a).

In Comparative Example 1, adhesion strength of the copper foil laminated polyimide film was not less than 1 N/mm, and filling characteristics was also satisfactory. However, 90° peel strength of a laminated sheet was as low as 0.16 N/mm.

The results of measurements of 90° peel strength of laminated sheets, in which the epoxy bonding sheet was laminated on the polyimide film, indicate that the copper foil laminated polyimide films of Examples 2-7 were superior to the copper foil laminated polyimide film of Example 1. That may be due to difference in the surface area ratio (B) of the copper foil.

The results of evaluations of the copper foil laminated polyimide films indicate the following matters.

1) In all of Examples 1-7 and Comparative Examples 1-2, adhesion strength between the copper foil and the polyimide film were not less than 1.1 N/mm.

2) In Examples 1-4, 6 and 7, adhesion strength were not less than 1.2 N/mm. In Example 5, adhesion strength was less than Examples 1-4, 6 and 7. That may be due to difference in the lightness (L value) of the copper foil.

3) In terms of filling characteristics, the copper foil laminated polyimide films of Examples 1-5 and 7 were superior to the copper foil laminated polyimide film of Example 6. That may be due to difference in the surface roughness (Rzjis) of the copper foil.

INDUSTRIAL APPLICABILITY

In the present invention, a metal foil such as a copper foil to be bonded to a base material of a polyimide resin substrate has a surface on which fine roughening particles are uniformly formed. Therefore, a metal foil laminated polyimide resin substrate comprising the metal foil may exhibit excellent adhesiveness of the polyimide resin surface which is exposed by removing the metal foil (resin base material surface) to an adhesive material such as an ACF, resulting in the prevention of the detachment of electronic components, for example.

Furthermore, a metal foil laminated polyimide resin substrate of the present invention may exhibit excellent formability of fine wiring, and the wiring formed may have excellent chemical resistance and moisture absorption resistance.

The invention claimed is:

1. A laminate comprising an adhesive organic material layer and a sol imide resin substrate wherein the adhesive organic material layer is laminated on a surface of the polyimide resin substrate which is exposed by removing at least a portion of a metal foil of a metal foil laminated polyimide resin substrate wherein the metal foil is directly laminated on the polyimide resin substrate; and the surface of the metal foil to be bonded to the polyimide resin substrate has:

a surface roughness (Rzjis) of 3.0 $\mu m$ or less;

a surface area ratio (B) of 1.25 to 2.50, in which the surface area ratio (B) is calculated as a ratio [A/6550] of a surface area of a two-dimensional region with a surface area of 6550 $\mu m^2$ which is determined by a laser method (three-dimensional area: A $\mu m^2$) to the area of the two-dimensional region; and a chromium content per unit area of the two-dimensional region of 2.0 $mg/m^2$ or more, and roughening particles are formed on the surface of the metal foil to be bonded to the polyimide resin substrate.

2. The laminate as claimed in claim 1, wherein the metal foil has a roughened surface to be bonded to the polyimide resin substrate, the metal foil is produced by roughening a surface of a untreated metal foil to be bonded to the polyimide resin substrate, which has a surface roughness (Rzjis) of less than 1.0 $\mu m$ before surface roughening, and a ratio [b/a] of the surface area after surface roughening (three-dimensional area: b $\mu m^2$) to the surface area before surface roughening (three-dimensional area: a $\mu m^2$) of a two-dimensional region with a surface area of 6550 $\mu m^2$ which is determined by a laser method is in the range of 1.20 to 2.50.

3. The laminate as claimed in claim 1, wherein the surface of the metal foil to be bonded to the polyimide resin substrate comprises a nickel-zinc alloy layer in an amount of 40 $mg/m^2$ or more per unit area of the two-dimensional region.

4. The laminate as claimed in claim 1, wherein the surface of the metal foil to be bonded to the polyimide resin substrate has an L value of from 47 to 63 in the Lab color coordinate system.

5. The laminate as claimed in claim 1, wherein the surface of the metal foil to be bonded to the polyimide resin substrate has a surface area ratio (B) of 1.60 to 2.50, in which the surface area ratio (B) is calculated as a ratio [A/6550] of a surface area of a two-dimensional region with a surface area of 6550 μm² which is determined by a laser method (three-dimensional area: A μm²) to the area of the two-dimensional region.

6. The laminate as claimed in claim 1, wherein the surface of the metal foil to be bonded to the polyimide resin substrate has a surface roughness (Rzjis) of 2.5 μm or less.

7. The laminate as claimed in claim 1, wherein the surface of the metal foil to be bonded to the polyimide resin substrate has a surface roughness (Rzjis) of 2.5 μm or less; and a surface area ratio (B) of 1.60 to 2.50, in which the surface area ratio (B) is calculated as a ratio [A/6550] of a surface area of a two-dimensional region with a surface area of 6550 μm² which is determined by a laser method (three-dimensional area: A μm²) to the area of the two-dimensional region.

8. The laminate as claimed in claim 1, wherein the surface of the metal foil to be bonded to the polyimide resin substrate has a coupling agent layer.

9. The laminate as claimed in claim 1, wherein the metal foil is an electrolytic copper foil.

10. The laminate as claimed in claim 1, wherein the polyimide resin substrate comprises a heat-resistant polyimide layer and a thermocompression-bondable polyimide layer, which is laminated on at least one side of the heat-resistant polyimide layer; and the metal foil is laminated on the thermocompression-bondable polyimide layer.

11. The laminate as claimed in claim 1, wherein the polyimide resin substrate has a thermocompression-bondable surface to be bonded to the metal foil; and
the metal foil is bonded to the thermocompression-bondable surface of the polyimide resin substrate using a hot-press forming machine.

12. The laminate as claimed in claim 11, wherein a thickness of the thermocompression-bondable layer of the polyimide resin substrate to be bonded to the metal foil is equal to or greater than a surface roughness (Rzjis) of the surface of the metal foil to be bonded to the polyimide resin substrate.

13. The laminate as claimed in claim 11, wherein a thickness of the thermocompression-bondable layer of the polyimide resin substrate to be bonded to the metal foil is equal to or greater than a surface roughness (Rzjis) of the surface of the metal foil to be bonded to the polyimide resin substrate, and is less than or equal to 3 μm.

14. A wiring board comprising the laminate as claimed in claim 1, wherein a metal wiring is formed by etching the metal foil of the metal foil laminated polyimide resin substrate.

15. The wiring board as claimed in claim 14, wherein the adhesive organic material layer is laminated on the metal wiring side.

16. The wiring board as claimed in claim 15, wherein the adhesive organic material layer comprises epoxy.

17. A process for producing a laminate as claimed in claim 1, comprising bonding a surface of a metal foil to a thermocompression bondable surface of a polyimide resin substrate using a hot-press forming machine to form a metal foil laminated polyimide resin substrate, wherein the metal foil has the following properties:

a surface roughness (Rzjis) is 3.0 μm or less;
a surface area ratio (B) is 1.25 to 2.50, in which the surface area ratio (B) is calculated as a ratio [A/6550] of a surface area of a two-dimensional region with a surface area of 6550 μm² which is determined by a laser method (three-dimensional area: A μm²) to the area of the two-dimensional region; and
a chromium content per unit area of the two-dimensional region is at least 2.0 mg/m²;
removing at least a portion of the metal foil of the metal foil laminated polyimide resin substrate; and
laminating an adhesive organic material layer on at least a portion of the exposed surface of the polyimide resin substrate.

18. The laminate as claimed in claim 1, wherein the roughening particles have a substantially spherical shape.

* * * * *

UNITED STATES PATENT AND TRADEMARK OFFICE
CERTIFICATE OF CORRECTION

PATENT NO. : 8,624,125 B2  Page 1 of 1
APPLICATION NO. : 12/739640
DATED : January 7, 2014
INVENTOR(S) : Hiroto Shimokawa and Atsushi Okabe It is certified that error appears in the above-identified patent and that said Letters Patent is hereby corrected as shown below:

In the Claims:

In Column 36, Line 31, In Claim 1, change "sol imide" to --polyimide--.

In Column 36, Line 31, In Claim 1, change "substrate" to --substrate,--.

Signed and Sealed this
Twelfth Day of August, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,624,125 B2  Page 1 of 1
APPLICATION NO. : 12/739640
DATED : January 7, 2014
INVENTOR(S) : Shimokawa et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 541 days.

Signed and Sealed this
Twenty-second Day of September, 2015

Michelle K. Lee
*Director of the United States Patent and Trademark Office*